United States Patent
Fitzpatrick et al.

(10) Patent No.: US 9,021,319 B2
(45) Date of Patent: Apr. 28, 2015

(54) NON-VOLATILE MEMORY MANAGEMENT SYSTEM WITH LOAD LEVELING AND METHOD OF OPERATION THEREOF

(75) Inventors: James Fitzpatrick, Sudbury, MA (US); Bernardo Rub, Sudbury, MA (US); James Higgins, Chandler, AZ (US); Ryan Jones, Mesa, AZ (US); Robert W. Ellis, Phoenix, AZ (US)

(73) Assignee: Smart Storage Systems, Inc., Milpitas, CA (US)

( * ) Notice: Subject to any disclaimer, the term of this patent is extended or adjusted under 35 U.S.C. 154(b) by 192 days.

(21) Appl. No.: 13/601,607

(22) Filed: Aug. 31, 2012

(65) Prior Publication Data

US 2013/0061101 A1 Mar. 7, 2013

Related U.S. Application Data

(60) Provisional application No. 61/530,821, filed on Sep. 2, 2011.

(51) Int. Cl.
| | | |
|---|---|---|
| G06F 11/00 | (2006.01) | |
| G11C 16/34 | (2006.01) | |
| G11C 29/50 | (2006.01) | |
| G11C 16/00 | (2006.01) | |

(52) U.S. Cl.
CPC ........ G11C 16/349 (2013.01); G11C 29/50004 (2013.01); *G11C 16/00* (2013.01); *G11C 2029/5002* (2013.01)

(58) Field of Classification Search
CPC ........... G11C 16/00; G11C 2029/5002; G11C 29/50004; G11C 16/349; G11C 11/56; G11C 16/28; G11C 29/02; G11C 29/026; G11C 29/028; G11C 16/26; G11C 11/1068; G11C 16/3418; G11C 29/50016; G11C 29/42; G11C 2029/0409; G06F 12/0246
See application file for complete search history.

(56) References Cited

U.S. PATENT DOCUMENTS

| | | | |
|---|---|---|---|
| 4,048,481 | A | 9/1977 | Bailey, Jr. et al. |
| 4,839,587 | A | 6/1989 | Flatley et al. |
| 5,034,744 | A | 7/1991 | Obinata |
| 5,311,395 | A | 5/1994 | McGaha et al. |

(Continued)

FOREIGN PATENT DOCUMENTS

| | | |
|---|---|---|
| EP | 1 956 489 A2 | 8/2008 |
| EP | 1 990 921 A2 | 11/2008 |

(Continued)

OTHER PUBLICATIONS

Ulinktech, "ATA Command Table (in Alphabetic Order)," Feb. 6, 2011, https://web.archive.org/web/20110206060820/http://www.ulinktech.com/downloads/AT, 6 pages.

(Continued)

*Primary Examiner* — Guerrier Merant
(74) *Attorney, Agent, or Firm* — Morgan, Lewis & Bockius LLP

(57) ABSTRACT

A method of operation of a non-volatile memory system includes: generating a test stimulus for a page in a memory array; measuring a test response from the page in the memory array based on the test stimulus; calculating a measured effective life of the page from the test response; and determining a use plan according to the measured effective life for accessing the page.

20 Claims, 5 Drawing Sheets

(56) References Cited

U.S. PATENT DOCUMENTS

| | | |
|---|---|---|
| 5,479,638 A | 12/1995 | Assar et al. |
| 5,790,828 A | 8/1998 | Jost |
| 5,930,504 A | 7/1999 | Gabel |
| 5,949,785 A | 9/1999 | Beasley |
| 5,963,983 A | 10/1999 | Sakakura et al. |
| 6,069,827 A | 5/2000 | Sinclair |
| 6,091,652 A | 7/2000 | Haehn et al. |
| 6,275,436 B1 | 8/2001 | Tobita et al. |
| 6,345,367 B1 | 2/2002 | Sinclair |
| 6,356,447 B2 | 3/2002 | Scafidi |
| 6,381,670 B1 | 4/2002 | Lee et al. |
| 6,412,080 B1 | 6/2002 | Fleming et al. |
| 6,529,997 B1 | 3/2003 | Debiez et al. |
| 6,552,581 B1 | 4/2003 | Gabara |
| 6,587,915 B1 | 7/2003 | Kim |
| 6,618,249 B2 | 9/2003 | Fairchild |
| 6,661,503 B1 | 12/2003 | Yamaguchi et al. |
| 6,728,913 B1 | 4/2004 | Parker |
| 6,763,424 B2 | 7/2004 | Conley |
| 6,775,792 B2 | 8/2004 | Ulrich et al. |
| 6,778,387 B2 | 8/2004 | Fairchild |
| 6,850,443 B2 | 2/2005 | Lofgren et al. |
| 6,854,070 B2 | 2/2005 | Johnson et al. |
| 6,871,304 B2 | 3/2005 | Hadjihassan et al. |
| 6,903,972 B2 | 6/2005 | Lasser et al. |
| 6,906,961 B2 | 6/2005 | Eggleston et al. |
| 6,975,028 B1 | 12/2005 | Wayburn et al. |
| 7,082,495 B2 | 7/2006 | DeWhitt et al. |
| 7,107,389 B2 | 9/2006 | Inagaki et al. |
| 7,139,864 B2 | 11/2006 | Bennett et al. |
| 7,233,497 B2 | 6/2007 | Simon et al. |
| 7,243,186 B2 | 7/2007 | Liang et al. |
| 7,298,888 B2 | 11/2007 | Hamar |
| 7,330,927 B1 | 2/2008 | Reeve et al. |
| 7,333,364 B2 | 2/2008 | Yu et al. |
| 7,350,101 B1 | 3/2008 | Nguyen et al. |
| 7,355,896 B2 | 4/2008 | Li et al. |
| 7,434,122 B2 | 10/2008 | Jo |
| 7,441,067 B2 | 10/2008 | Gorobets et al. |
| 7,516,267 B2 | 4/2009 | Coulson et al. |
| 7,613,871 B2 | 11/2009 | Tanaka et al. |
| 7,620,710 B2 | 11/2009 | Kottomtharayil et al. |
| 7,620,769 B2 | 11/2009 | Lee et al. |
| 7,639,532 B2 | 12/2009 | Roohparvar et al. |
| 7,661,054 B2 | 2/2010 | Huffman et al. |
| 7,679,948 B2 | 3/2010 | Park et al. |
| 7,693,422 B2 | 4/2010 | Alicherry et al. |
| 7,738,502 B2 | 6/2010 | Chang et al. |
| 7,743,216 B2 | 6/2010 | Lubbers et al. |
| 7,818,525 B1 | 10/2010 | Frost et al. |
| 7,827,348 B2 | 11/2010 | Lee et al. |
| 7,830,164 B2 | 11/2010 | Earle et al. |
| 7,979,614 B1 | 7/2011 | Yang |
| 8,001,135 B2 | 8/2011 | Perlmutter et al. |
| 8,010,738 B1 | 8/2011 | Chilton et al. |
| 8,028,123 B2 | 9/2011 | Kilzer et al. |
| 8,046,645 B2 | 10/2011 | Hsu et al. |
| 8,051,241 B2 | 11/2011 | Feldman et al. |
| 8,072,805 B2 | 12/2011 | Chou et al. |
| 8,095,724 B2 | 1/2012 | Ji et al. |
| 8,095,765 B2 | 1/2012 | Asnaashari et al. |
| 8,117,396 B1 | 2/2012 | Fair et al. |
| 8,127,202 B2 | 2/2012 | Cornwell et al. |
| 8,145,984 B2 | 3/2012 | Sommer et al. |
| 8,154,921 B2 | 4/2012 | Mokhlesi et al. |
| 8,169,825 B1 | 5/2012 | Shalvi et al. |
| 8,219,724 B1 | 7/2012 | Caruso et al. |
| 8,219,776 B2 | 7/2012 | Forhan et al. |
| 8,228,701 B2 | 7/2012 | Sokolov et al. |
| 8,245,101 B2 | 8/2012 | Olbrich et al. |
| 8,254,172 B1 | 8/2012 | Kan |
| 8,259,506 B1 | 9/2012 | Sommer et al. |
| 8,289,801 B2 | 10/2012 | Smith et al. |
| 8,296,534 B1 | 10/2012 | Gupta et al. |
| 8,332,578 B2 | 12/2012 | Frickey, III et al. |
| 8,363,413 B2 | 1/2013 | Paquette et al. |
| 8,369,141 B2 | 2/2013 | Sommer et al. |
| 8,386,700 B2 | 2/2013 | Olbrich et al. |
| 8,386,860 B2 | 2/2013 | Tseng et al. |
| 8,407,409 B2 | 3/2013 | Kawaguchi |
| 8,464,106 B2 | 6/2013 | Filor et al. |
| 8,503,238 B1 | 8/2013 | Wu et al. |
| 8,612,804 B1 | 12/2013 | Kang et al. |
| 2002/0056025 A1 | 5/2002 | Qiu et al. |
| 2002/0159285 A1 | 10/2002 | Morley et al. |
| 2003/0033308 A1 | 2/2003 | Patel et al. |
| 2003/0046603 A1 | 3/2003 | Harari et al. |
| 2003/0074592 A1 | 4/2003 | Hasegawa |
| 2003/0163633 A1 | 8/2003 | Aasheim et al. |
| 2004/0080985 A1 | 4/2004 | Chang et al. |
| 2004/0088511 A1 | 5/2004 | Bacon et al. |
| 2004/0252670 A1 | 12/2004 | Rong et al. |
| 2005/0021904 A1 | 1/2005 | Iaculo et al. |
| 2005/0038792 A1 | 2/2005 | Johnson |
| 2005/0073884 A1 | 4/2005 | Gonzalez et al. |
| 2005/0144516 A1 | 6/2005 | Gonzalez et al. |
| 2006/0015683 A1 | 1/2006 | Ashmore et al. |
| 2006/0020745 A1 | 1/2006 | Conley et al. |
| 2006/0136682 A1 | 6/2006 | Haridas et al. |
| 2006/0143365 A1 | 6/2006 | Kikuchi |
| 2006/0253641 A1 | 11/2006 | Gatzemeier et al. |
| 2006/0256624 A1 | 11/2006 | Eggleston et al. |
| 2006/0282644 A1 | 12/2006 | Wong |
| 2006/0294574 A1 | 12/2006 | Cha |
| 2007/0050536 A1 | 3/2007 | Kolokowsky |
| 2007/0061511 A1 | 3/2007 | Faber |
| 2007/0083779 A1 | 4/2007 | Misaka et al. |
| 2007/0234004 A1 | 10/2007 | Oshima et al. |
| 2007/0260811 A1 | 11/2007 | Merry, Jr. et al. |
| 2007/0263444 A1 | 11/2007 | Gorobets et al. |
| 2007/0276973 A1 | 11/2007 | Tan et al. |
| 2008/0046630 A1 | 2/2008 | Lasser |
| 2008/0052446 A1 | 2/2008 | Lasser et al. |
| 2008/0082736 A1 | 4/2008 | Chow et al. |
| 2008/0126720 A1 | 5/2008 | Danilak |
| 2008/0183918 A1 | 7/2008 | Dhokia et al. |
| 2008/0313505 A1 | 12/2008 | Lee et al. |
| 2009/0019321 A1 | 1/2009 | Radke |
| 2009/0083587 A1 | 3/2009 | Ng et al. |
| 2009/0089485 A1 | 4/2009 | Yeh |
| 2009/0125670 A1 | 5/2009 | Keays |
| 2009/0138654 A1 | 5/2009 | Sutardja |
| 2009/0146721 A1 | 6/2009 | Kurooka et al. |
| 2009/0157948 A1 | 6/2009 | Trichina et al. |
| 2009/0164702 A1 | 6/2009 | Kern |
| 2009/0172262 A1 | 7/2009 | Olbrich et al. |
| 2009/0228761 A1 | 9/2009 | Perlmutter et al. |
| 2009/0259819 A1 | 10/2009 | Chen et al. |
| 2009/0259896 A1 | 10/2009 | Hsu et al. |
| 2009/0271562 A1 | 10/2009 | Sinclair |
| 2009/0287975 A1 | 11/2009 | Kim et al. |
| 2009/0323419 A1 | 12/2009 | Lee et al. |
| 2009/0327581 A1 | 12/2009 | Coulson |
| 2009/0327591 A1 | 12/2009 | Moshayedi |
| 2010/0017650 A1 | 1/2010 | Chin et al. |
| 2010/0023674 A1 | 1/2010 | Aviles |
| 2010/0050053 A1 | 2/2010 | Wilson et al. |
| 2010/0128537 A1 | 5/2010 | Suhail et al. |
| 2010/0138592 A1 | 6/2010 | Cheon |
| 2010/0169541 A1 | 7/2010 | Freikorn |
| 2010/0172179 A1 | 7/2010 | Gorobets et al. |
| 2010/0174845 A1 | 7/2010 | Gorobets et al. |
| 2010/0217898 A1 | 8/2010 | Priborsky et al. |
| 2010/0217915 A1 | 8/2010 | O'Connor et al. |
| 2010/0228928 A1 | 9/2010 | Asnaashari et al. |
| 2010/0262792 A1* | 10/2010 | Hetzler et al. .............. 711/156 |
| 2010/0262795 A1 | 10/2010 | Hetzler et al. |
| 2010/0262875 A1 | 10/2010 | Hetzler et al. |
| 2010/0287328 A1 | 11/2010 | Feldman et al. |
| 2010/0293367 A1 | 11/2010 | Berke et al. |
| 2010/0312954 A1* | 12/2010 | Jeon et al. .............. 711/103 |
| 2010/0318719 A1 | 12/2010 | Keays et al. |
| 2010/0332726 A1 | 12/2010 | Wang |
| 2011/0002224 A1 | 1/2011 | Tamura |

(56) References Cited

U.S. PATENT DOCUMENTS

| | | |
|---|---|---|
| 2011/0016239 A1 | 1/2011 | Stenfort |
| 2011/0055468 A1 | 3/2011 | Gonzalez et al. |
| 2011/0066788 A1 | 3/2011 | Eleftheriou et al. |
| 2011/0078393 A1 | 3/2011 | Lin |
| 2011/0099342 A1 | 4/2011 | Ozdemir |
| 2011/0131365 A1 | 6/2011 | Zhang et al. |
| 2011/0131447 A1 | 6/2011 | Prakash et al. |
| 2011/0132000 A1 | 6/2011 | Deane et al. |
| 2011/0145473 A1 | 6/2011 | Maheshwari |
| 2011/0161775 A1 | 6/2011 | Weingarten |
| 2011/0190963 A1 | 8/2011 | Glassl et al. |
| 2011/0191522 A1 | 8/2011 | Condict et al. |
| 2011/0191649 A1 | 8/2011 | Lim et al. |
| 2011/0209032 A1 | 8/2011 | Choi et al. |
| 2011/0238892 A1 | 9/2011 | Tsai et al. |
| 2011/0239088 A1 | 9/2011 | Post |
| 2011/0314219 A1 | 12/2011 | Ulrich et al. |
| 2011/0320687 A1 | 12/2011 | Belluomini et al. |
| 2012/0008401 A1 | 1/2012 | Katz et al. |
| 2012/0011336 A1 | 1/2012 | Saika |
| 2012/0047318 A1 | 2/2012 | Yoon et al. |
| 2012/0047320 A1 | 2/2012 | Yoo et al. |
| 2012/0047409 A1 | 2/2012 | Post et al. |
| 2012/0066450 A1 | 3/2012 | Yochai et al. |
| 2012/0124046 A1 | 5/2012 | Provenzano |
| 2012/0124273 A1 | 5/2012 | Goss et al. |
| 2012/0151260 A1 | 6/2012 | Zimmermann et al. |
| 2012/0213004 A1 | 8/2012 | Yun et al. |
| 2012/0216085 A1* | 8/2012 | Weingarten et al. .......... 714/718 |
| 2012/0236656 A1 | 9/2012 | Cometti |
| 2012/0239858 A1* | 9/2012 | Melik-Martirosian ....... 711/103 |
| 2012/0266048 A1 | 10/2012 | Chung et al. |
| 2012/0297113 A1 | 11/2012 | Belluomini et al. |
| 2012/0324191 A1 | 12/2012 | Strange et al. |
| 2012/0331207 A1 | 12/2012 | Lassa et al. |
| 2013/0007380 A1 | 1/2013 | Seekins et al. |
| 2013/0007543 A1 | 1/2013 | Goss et al. |
| 2013/0054881 A1 | 2/2013 | Ellis et al. |
| 2013/0060994 A1 | 3/2013 | Higgins et al. |
| 2013/0073788 A1 | 3/2013 | Post et al. |
| 2013/0080691 A1* | 3/2013 | Weingarten et al. .......... 711/103 |
| 2013/0094289 A1 | 4/2013 | Sridharan et al. |
| 2013/0100600 A1 | 4/2013 | Yin et al. |
| 2013/0124792 A1* | 5/2013 | Melik-Martirosian et al. ............................ 711/103 |
| 2013/0151753 A1 | 6/2013 | Jeon et al. |
| 2013/0238833 A1 | 9/2013 | Vogan et al. |
| 2013/0265825 A1 | 10/2013 | Lassa |
| 2014/0108891 A1* | 4/2014 | Strasser et al. ................ 714/773 |
| 2014/0129874 A1 | 5/2014 | Zaltsman et al. |
| 2014/0208174 A1 | 7/2014 | Ellis et al. |

FOREIGN PATENT DOCUMENTS

| | | |
|---|---|---|
| JP | 2012129859 A | 7/2012 |
| WO | WO 2009/042298 A1 | 4/2009 |
| WO | WO 2011/156466 A2 | 12/2011 |

OTHER PUBLICATIONS

International Search Report and Written Opinion dated May 14, 2014, received in International Patent Application No. PCT/US2014/017168, which corresponds to U.S. Appl. No. 14/076,115, 6 pages (Fitzpatrick).

International Search Report and Written Opinion dated May 14, 2014, received in International Patent Application No. PCT/US2014/017169, which corresponds to U.S. Appl. No. 14/076,148, 6 pages (Fitzpatrick).

International Search Report dated Mar. 25, 2014, received in International Patent Application No. PCT/US2013/072400, which corresponds to U.S. Appl. No. 13/690,337, 3 pages (Ellis).

International Search Report and Written Opinion dated Jun. 12, 2014, received in PCT/US2014/018972, which corresponds to U.S. Appl. No. 13/779,352, 12 pages (Schmier).

Invitation to Pay Additional Fees dated Jul. 25, 2014, received in International Patent Application No. PCT/US2014/021290, which corresponds to U.S. Appl. No. 13/791,797, 8 pages (Dean).

International Search Report and Written Opinion dated Jul. 31, 2004, received in International Patent Application No. PCT/US2014/031465, which corresponds to U.S. Appl. No. 13/851,928, 13 pages (Ellis).

International Search Report and Written Opinion dated Jul. 31, 2014, received in International Patent Application No. PCT/US2014/033876, which corresponds to U.S. Appl. No. 13/861,326, 9 pages (Fitzpatrick).

Cooke, "Introduction to Flash Memory (T1A)," Flash Memory Summit, Aug. 22, 2008, Micron Technology, Inc., 102 pages.

Gal et al., "Algorithms and Data Structures for Flash Memories," ACM Computing Surveys, Jun. 2005, vol. 37, No. 2, 30 pages.

IBM Corporation, "Systems Management, Work Management," Version 5, Release 4, 9th Edition, Feb. 2006, pp. 1-21.

O'Brien, "SMART Storage Systems Optimus SAS Enterprise SSD Review," SMART Storage Systems, Oct. 9, 2012, 44 pages.

Spanjer, "Flash Management—Why and How?" Smart Modular Technologies, Nov. 2009, http://www.scantec.de/fileadmin/pdf/Smart_Modular/Flash-Management.pdf, 14 pages.

Texas Instruments, "Power Management IC For Digital Set Top Boxes," SLVSA10A, Sep. 2009, pp. 1-22.

International Search Report and Written Opinion dated Dec. 20, 2013, received in PCT/US2013/045282, which corresponds to U.S. Appl. No. 13/493,949, 7 pages (Ellis).

International Search Report and Written Opinion dated Aug. 22, 2014, received in International Patent Application No. PCT/US2014/032978, which corresponds to U.S. Appl. No. 14/081,992, 10 pages (Ellis).

International Search Report and Written Opinion dated Nov. 7, 2014, received in International Patent Application No. PCT/US2014/049732, which corresponds to U.S. Appl. No. 14/334,350, 13 pages (Fitzpatrick).

International Search Report and Written Opinion dated Oct. 17, 2014, received in International Patent Application No. PCT/US2014/049734, which corresponds to U.S. Appl. No. 14/332,259, 8 pages (Higgins).

International Search Report and Written Opinion dated Oct. 23, 2014, received in International Patent Application No. PCT/US2014/049736, which corresponds to U.S. Appl. No. 14/446,249 8 pages (Fitzpatrick).

International Search Report and Written Opinion dated Nov. 5, 2014, received in International Patent Application No. PCT/US2014/049282, which corresponds to U.S. Appl. No. 13/957,407, 12 pages (Fitzpatrick).

* cited by examiner

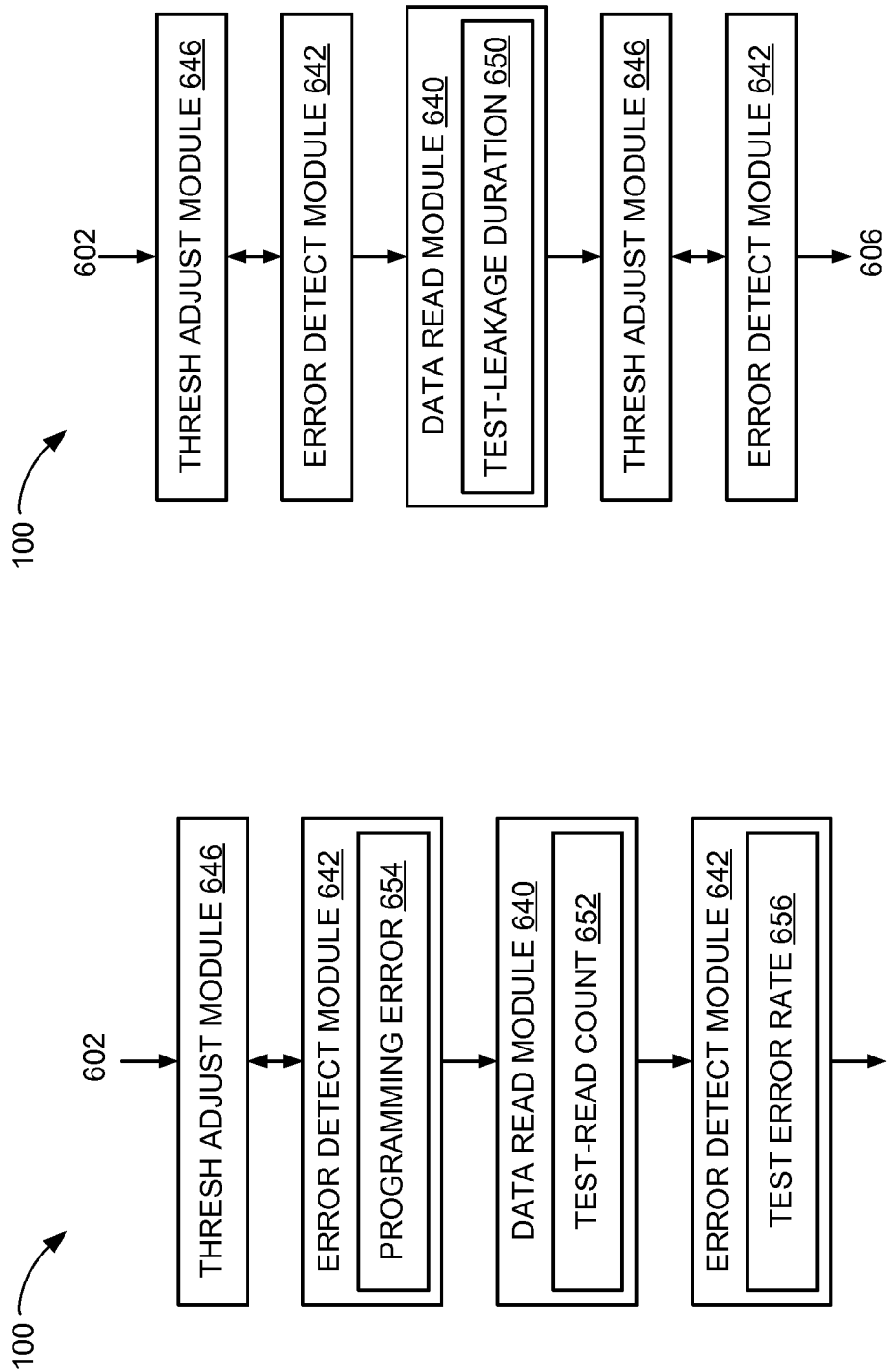

NON-VOLATILE MEMORY MANAGEMENT SYSTEM WITH LOAD LEVELING AND METHOD OF OPERATION THEREOF

CROSS-REFERENCE TO RELATED APPLICATION

This application claims the benefit of U.S. Provisional Patent Application Ser. No. 61/530,821 filed Sep. 2, 2011, and the subject matter thereof is incorporated herein by reference thereto.

TECHNICAL FIELD

The present invention relates generally to a non-volatile memory system, and more particularly to a system for managing erase blocks within a non-volatile memory system.

BACKGROUND ART

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, cellular telephones, and removable memory modules, and the uses for non-volatile memory continue to expand.

Flash memory and other non-volatile memories are often grouped into sections called "erase blocks." Each of the cells within an erase block can be electrically programmed selectively by altering the threshold voltage of an individual cell from an initial state. However, cells of the erase block are erased, or reverted to their initial state, generally in a single operation across the entire block. Any data in the erase block that is to be retained by the memory device must first be copied to another location or buffer before performing the erase operation.

In part because of their large block sizes, NAND devices are primarily used for storing data, such as audio, video or image files. Such files are frequently read, but generally infrequently modified. Increasingly, however, NAND devices are being designed into embedded systems. Such systems have need for code and temporary parameter storage as well as data storage. However, code and parameter data requires relatively frequent modification, requiring frequent and extensive movement or buffering of the data in a block that is to be retained. As memory densities continue to increase, block sizes are also tending to increase, thus exacerbating this problem.

NAND flash is said to be able to work reliably until the number of program and erase (PE) cycles applied exceeds a value specified by the flash vendor. As a result, SSD vendors have designed drives to limit the number of PE cycles to stay below the specified limit on each device in the drive. This process of applying the same number of PE cycles to each block is known as wear leveling.

Traditional wear leveling works under the premise that no device should be used any more than the weakest device in the system. As a result, many blocks that have capability beyond the weakest of the population are left under utilized by traditional wear leveling.

Thus, a need still remains for a non-volatile memory management system. In view of the expanding applications of non-volatile memory into dynamic data management systems, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a non-volatile memory system including: generating a test stimulus for a page in a memory array; measuring a test response from the page in the memory array based on the test stimulus; calculating a measured effective life of the page from the test response; and determining a use plan according to the measured effective life for accessing the page.

The present invention provides a non-volatile memory system, including: a stimulus module for generating a test stimulus for a page in a memory array; a response module, connected to the stimulus module, for measuring a test response from the page in the memory array based on the test stimulus; a reliability calculation module, connected to the response module, for calculating a measured effective life of the page from the test response; and a balance plan module, connected to the reliability calculation module, for determining a use plan according to the measured effective life for accessing the page.

Certain embodiments of the invention have other steps or elements in addition to or in place of those mentioned above. The steps or element will become apparent to those skilled in the art from a reading of the following detailed description when taken with reference to the accompanying drawings.

BRIEF DESCRIPTION OF THE DRAWINGS

FIG. 7 is a detailed example flow within the response module of FIG. 6.

FIG. 8 is a further detailed example flow within the response module of FIG. 6.

BEST MODE FOR CARRYING OUT THE INVENTION

Figure 1:
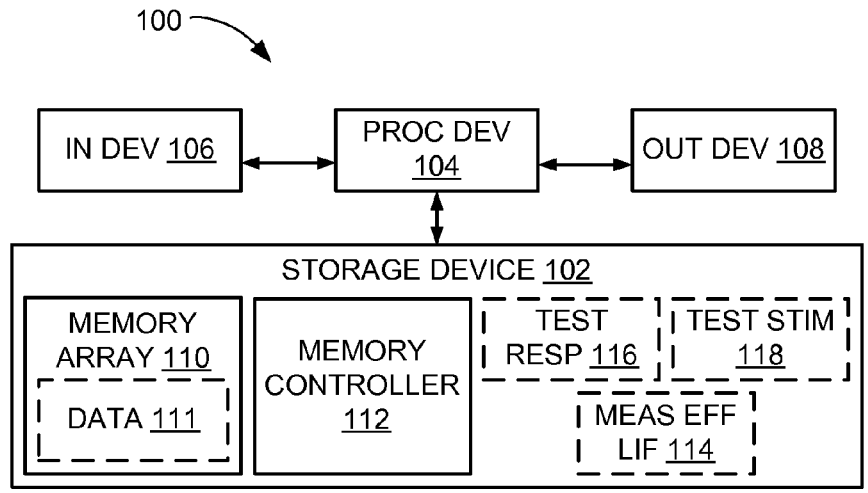
FIG. 1 is a functional block diagram of a non-volatile memory system with block-life measurement mechanism in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The term "module" referred to herein can include software, hardware, or a combination thereof in accordance with the context in which the term is used. For example, the software can be machine code, firmware, embedded code, and application software. Also for example, the hardware can be circuitry, processor, computer, integrated circuit, integrated circuit cores, a pressure sensor, an inertial sensor, a microelectromechanical system (MEMS), passive devices, or a combination thereof.

Referring now to FIG. 1, therein is shown a functional block diagram of a non-volatile memory system 100 with block-life measurement mechanism in an embodiment of the present invention. The non-volatile memory system 100, such as a desktop computer, a smart phone, or a testing system, can also have a storage device 102, a processing device 104, an input device 106, and an output device 108. The storage device 102 can be connected to the processing device 104. The processing device 104 can be connected to the input device 106 and the output device 108.

Connections between devices, units, modules, or other components can be made using various methods. For example, the connections can be made using wires or buses. Also for example, the connections can be made using communication protocol. The connections can have the connected components directly contacting each other through the connection medium, such as the wire or the bus. The connections can also have components connected to each other through other components.

The storage device 102 is defined as a device for storing data content 111 for operations of the non-volatile memory system 100. The storage device 102 can be flash memory and can be a NAND type memory device. The storage device 102 can include a non-volatile computer storage device, such as hard drives, memory cards, portable memory units, or a combination thereof.

The storage device 102 can have a memory array 110 and a memory controller 112. The memory array 110 is defined as a set of circuitry designed for holding and retaining the data content 111. The memory array 110 can be an arrangement of transistors and other passive devices for holding data. The storage device 102 can retain the data regardless of the status of input power for the non-volatile memory system 100.

The data content 111 can be a bit or a collection of bits representing information. The data content 111 can be stored in sub-divisions within the memory array 110. Accessing the data content 111, such as reading, writing, erasing, or a combination of operations thereof regarding the data content 111 can degrade reliability and capability of the hardware components within the memory array 110.

The memory array 110 can age or wear by having the reliability and capability of the memory array 110 degrade. The hardware components and various regions can degrade, such as by having the dielectric capabilities or the current flow characteristics become less effective, which can result in various effects. For example, the memory array 110 can age and shorten retention duration of the data content 111 or increase error rates for reading the data content 111.

The age or the reliability and the capability of the memory array 110 can be dynamically affected by time and usage. The aging effect of the memory array 110 can be caused by the various accessing operations along with time or retention duration. For example, while increase in retention duration can increase probability of error in reading the retained data, the increase in retention duration can also improve the performance of reliability and capability of the memory array 110.

The non-volatile memory system 100 can control the number of accesses for each of the subdivisions within the memory array 110 based on the age of the subdivisions. The non-volatile memory system 100 can control the number of accesses using calculations based on measured attributes of the memory array 110 instead of manufacturer specifications or rating information to even out the wear or the various ages throughout the memory array 110. Details regarding the measurement, the calculation, and the control for the accesses will be discussed below.

The memory controller 112 is defined as circuitry for controlling the overall operation of the storage device 102. The memory controller 112 can be implemented as a field programmable gate array (FPGA), not shown, or an application specific integrated circuit (ASIC), not shown, that stores and executes the instructions for controlling the memory array 110. The memory controller 112 can control operations such as read, write, and erase with the memory array 110.

For example, the memory controller 112 can process address information, send control signals, receive responses, analyze the responses, or a combination thereof for the memory array 110. Also, for example, the memory controller 112 can manage the wearing of the hardware in the memory array 110 by controlling the number of operations performed by different portions within the memory array 110.

The storage device 102 can have a measured effective life 114 for reliably storing data. The measured effective life 114 is defined as a measured indication of reliability or capability for the storage device 102. The measured effective life 114 can represent the age or the wear of the memory array 110 or the storage device 102 overall. The measured effective life 114 can be a number of executed operations, a measure of time, or a combination thereof.

For example, the measured effective life 114 can be a number of read, write, erase, or a combination of the operations the storage device 102 can execute. Also for example, the measured effective life 114 can be duration of time the storage device 102 can reliably retain the charges representing the stored data.

The measured effective life 114 can be related to a threshold value of reliability. Continuing with the example, the measured effective life 114 can be the number of operations the memory array 110 can perform with each operation being executed within a threshold number of retries or below an error rate. Also continuing with the example, the measured effective life 114 can be the duration of time the memory array 110 can store the charge within a threshold range.

The measured effective life 114 can be based on a measurement of a test response 116 to a test stimulus 118. The test stimulus 118 is defined as a designated input signal or sequence of operations for determining the reliability or performance of the memory array 110. For example, the test stimulus 118 can include a designated pulse or a sequence of control signals for operations including read, write, erase, or a combination thereof.

The test response 116 is defined as a measureable physical behavior of the memory array 110 in response to corresponding instances of the test stimulus 118. For example, the test response 116 can includes a number of 1s or 0s stored in the memory array 110, a bit error rate for performing an operation, amount of repetition required to complete the operation, amount of time required to complete the operation, or a combination thereof.

As a more specific example, the measured effective life 114 can be based on a response of the storage device 102 to a designated programming input or on a measured leakage time after data has been written to the measured effective life 114. Also as a more specific example, the measured effective life 114 can be based on an amount of time required to program or write, read, erase, or a combination thereof for the storage device 102. For further example, the measured effective life 114 can be based on a measured error rate for performing a write, read, erase, or a combination thereof.

The measured effective life 114 can be calculated based on the test response 116 of the memory array 110 in corresponding to the test stimulus 118 from the memory controller 112. For example, the measured effective life 114 can represent an equivalent amount of remaining operations, such as write, read, erase, or a combination thereof based on the test response 116. Also, for example, the measured effective life 114 can represent an equivalent hardware degradation profile based on the test response 116.

The measured effective life 114 can be measured and calculated dynamically by the memory controller 112. The measured effective life 114 can be used to manage the overall operations of the storage device 102 to maximize the overall use of the memory array 110. Details regarding the measurement and the calculation of the measured effective life 114 and the use thereof will be discussed below.

It has been discovered that the test stimulus 118 and the test response 116 provide accurate and specific characterization of the memory array 110. The test stimulus 118 and the test response 116 provide increased accuracy by quantifying and measuring actual reliability and limitations of specific portions within the memory array 110 instead of an overall generalized characterization provided by the manufacturer of the memory array 110.

It has further been discovered that the measured effective life 114 calculated using the test stimulus 118 and the test response 116 provide increased efficiency in using the memory array 110 and increased life-span for the storage device 102. The measured effective life 114 can provide the increased efficiency and increased life-span by accurately tracking the actual performance of the portions within the memory array 110, which can be used to accurately manage the wearing of the memory array 110.

The processing device 104 is defined as a device for calculating and processing data. The processing device 104 can include a control unit, not shown, and an algorithm and logic unit, not shown. For example, the processing device 104 can be Intel™ Pentium™ processor or a digital signal processing chip in a cellular phone.

The processing device 104 can also include a FPGA, not shown, or an ASIC, not shown. For example, the processing device 104 can be a stand-alone test unit or a configuration device having the FPGA, the ASIC, or a combination thereof for testing, configuring, or a combination of operations thereof for the storage device 102.

The processing device 104 can access the storage device 102. The processing device 104 can access the storage device 102 by reading the data on the storage device 102, writing to the storage device 102, or processing the data that is on the storage device 102. The processing device 104 can use RAM, cache memory, parallel processors, hardware accelerators, various interfaces, or a combination thereof to access the storage device 102 and process the data on the storage device 102.

The input device 106 is defined as a device for inputting data into the processing device 104. For example, the input device 106 can be a keyboard, a mouse, or a scanner. The output device 108 is defined as a device for outputting data from the processing device 104. For example, the output device 108 can be a computer monitor, a television, or a printer. In other embodiments, the input device 106 and the output device 108 can be combined into one device, such as a touchscreen display.

A user (not shown) can input the data to be processed or stored into the non-volatile memory system 100 using the input device 106. The processing device 104 can receive the inputted data and calculate or process the data. The resulting output data can be stored in the storage device 102, or the processing device 104 can output the resulting data to the output device 108.

Figure 2:
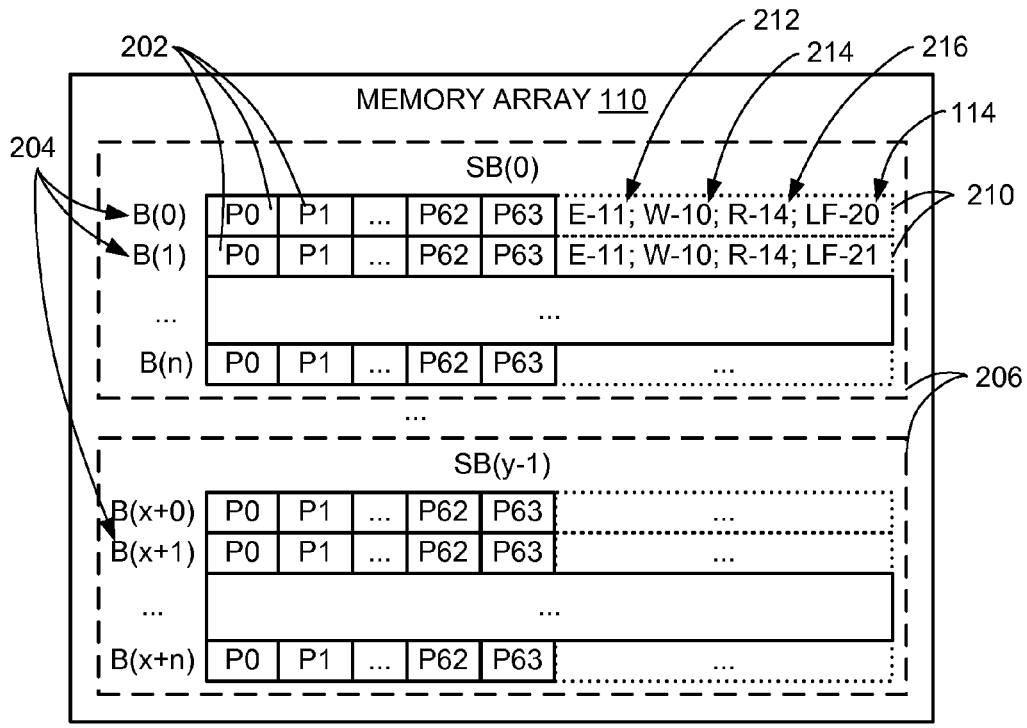
FIG. 2 is a detailed block diagram of the memory array.

Referring now to FIG. 2, therein is shown a detailed block diagram of the memory array 110. The memory array 110 can have instances of a page 202. The page 202 is defined as a unit of circuitry for retaining the data content 111 of FIG. 1. The page 202 can be circuitry having a grouping of transistors. For example, the page 202 can be a grouping of transistors for holding 4 kilobytes. Also for example, the page 202 can be a grouping of transistors identified by a physical or a logical address space within the memory array 110. Read and write operations can be performed for one or more instances of the page 202.

The memory array 110 can further have instances of the page 202 grouped into an erase block 204. The erase block 204 is defined to be an organization of individual memory cells that can be addressed in unison or managed as a group. For example, the erase block 204 can be 256 kilobytes or a grouping of 64 different instances of the page 202. Also for example, the erase block 204 can be a grouping of pages identified by a different physical or a different logical address space within the memory array 110. Erase operations can be performed for one or more instances of the erase block 204.

The memory array 110 can further have instances of the erase block 204 grouped into a super-block 206. The super-block 206 is defined as a grouping of erase blocks into an organized segment in which the erase blocks share similar relative age, endurance, retention characteristics, or a combination thereof. The super-block 206 can be a group of instances of the erase block 204 having similar values of the measured effective life 114 or similar wear level. Erase operations and recycling operations can be performed for one or more instances of the super-block 206.

The memory array 110 can have statistical data 210 corresponding to each instance of the page 202, each instance of the erase block 204, each instance of the super-block 206 or a combination thereof. For example, the memory array 110 can have a write count 214, a read count 216, the measured effective life 114 or a combination thereof corresponding to each instance of the page 202.

Also for example, the memory array 110 can have an erase count 212, the measured effective life 114, or a combination thereof corresponding to each instance of the erase block 204 or the super-block 206 in the statistical data 210. The statistical data 210 can be written into a first instance of the page 202 within the erase block 204 or the super-block 206.

The memory controller 112 of FIG. 1 can update the statistical data 210 to manage wearing of the memory array 110. The statistical data 210 can be updated at run time. During power down sequence for the non-volatile memory system 100 of FIG. 1, a read disturb metric can be recorded and used at power up. The read disturb metric is defined as the highest number of read count 216 among instances of the erase block 204 within an instance of the super-block 206.

The memory controller 112 can regroup instances of the erase block 204 having similar values of the statistical data 210 to form instances of the super-block 206. For example, the memory controller 112 can regroup instances of the erase block 204 having similar average values of the read count 216, the write count 214, or a combination thereof. Also, for example, the memory controller 112 can regroup instances of the erase block 204 having similar values of the erase count 212.

Given that all instances of the erase block 204 have relatively the same wear or age within each instance of the super-block 206 and that recycling is usually done on an entire super block at a time, the need to recycle the most-read block can be covered. This also limits the number of read counts to be saved at power cycles to only one count per super block.

Figure 3:
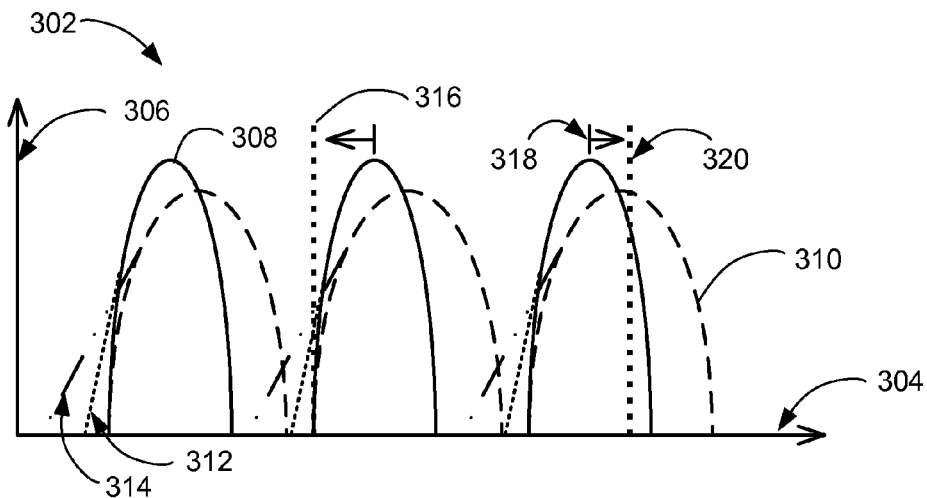
FIG. 3 is an example of the test response of FIG. 1.

Referring now to FIG. 3, therein is shown an example of the test response 116 of FIG. 1. The test response 116 can be characterized by a charge distribution profile 302. The charge distribution profile 302 is defined as a characterization of the changes in the electrical charges stored in the memory array 110 of FIG. 1. The charge distribution profile 302 can characterize the number of subdivisions or cells within the memory array 110 holding a measurable amount of charge. The charge distribution profile 302 can statistically characterize the memory array 110 as the memory array 110 ages relative to time, usage, or a combination thereof.

The charge distribution profile 302 can have a charge-amount axis 304 for representing various values of the measurable charge level. The charge-amount axis 304 can represent various voltage levels. The charge-amount axis 304 can be along a horizontal direction.

The charge distribution profile 302 can have a cell count axis 306 for representing a number of subdivisions or cells having the corresponding value of the measurable charge level. The cell count axis 306 can be along a vertical direction.

The storage device 102 can have various ranges of charge amounts represent a bit or a combination of bits. The storage device 102 can store charges within the range corresponding to a bit or a combination of bits. The capability and the reliability of achieving and retaining the targeted voltage corresponding to a desired data value for each cell can change with each access and retention duration.

For the memory array 110 having low value of age, the charge distribution profile 302 can be shown as a distribution graph with the cells holding charge levels within the range. For example, the charge distribution profile 302 can have a first curve, a second curve, a third curve, a fourth curve (not shown), or a combination thereof separated by gaps with each curve representing a cell holding voltage levels corresponding to a 1, a 0, a 00, a 01, a 10, a 11, or a combination thereof.

For the memory array 110 having high value of age, the charge distribution profile 302 can be shown as a distribution graph with the cells holding charge levels exceeding the range. For example, the charge distribution profile 302 can have various curves overlap each other and form one or more continuous curves across voltage levels corresponding to a 1, a 0, a 00, a 01, a 10, a 11, or a combination thereof.

The charge distribution profile 302 can characterize the storage capacity or behavior of the memory array 110 relative to age and wear with the various curves. The charge distribution profile 302 can have an initial distribution 308. The initial distribution 308 is defined as characterization of charge levels when the portion of the memory array 110 is in ideal condition or early in life.

The initial distribution 308 can be characterization of the designed capacity or ideal behavior of the circuits within the memory array 110. For example, the initial distribution 308 can be a designed or an initial charge distribution of charges corresponding to intended data in the memory array 110.

The initial distribution 308 can be calculated using the initial limitations or behavior of the material or components in the circuitry of the memory array 110. The initial distribution 308 can also be measured or provided by the manufacturer.

The charge distribution profile 302 can have an aged distribution 310. The aged distribution 310 is defined as characterization of changes in charge levels as the memory array 110 ages over a predetermined amount of time, usage, or a combination thereof.

The charge distribution profile 302 can have values of the aged distribution 310 corresponding to a specific value of age. The charge distribution profile 302 can have multiple instances of the aged distribution 310 each corresponding to different values of the predetermined amount of time, usage, or a combination thereof. The charge distribution profile 302 can also have a predetermined equation or method for calculating the aged distribution 310 based on the initial distribution 308, age based on amount of time, usage, or both, or a combination thereof.

As the memory array 110 ages, the charge distribution represented by the distribution plots can spread out over more area or wider range of voltages, represented as the aged distribution 310 being wider and extending further right than the initial distribution 308. Divisions or separations between of charge levels between intended data values can become smaller as the memory array 110 ages.

Further, maximum amount of the charge can drop as the memory array 110 ages. The effect of aging can be represented by the initial distribution 308 having higher intensity value or faster changes in slope than the aged distribution 310.

The charge distribution profile 302 can further characterize the loss of charge relative to time, usage, or a combination thereof. The charge distribution profile 302 can have an initial loss characterization 312 and an aged loss characterization 314.

The initial loss characterization 312 is defined as a characterization of charge levels after retaining the charges for a period of time when the portion of the memory array 110 is in ideal condition or early in life. For example, the initial loss characterization 312 can be the distribution of voltage levels or other charge measurements after the memory array 110 has retained the data content 111 for a specified duration. Also for example, the initial loss characterization 312 can be the initial distribution 308 changed over the specified duration.

The initial loss characterization 312 can be calculated using the initial limitations or behavior of the material or components in the circuitry of the memory array 110. The initial loss characterization 312 can also be measured or provided by the manufacturer.

The aged loss characterization 314 is defined characterization of charge levels after retaining the charges for a period of time when the portion of the memory array 110 has aged. The aged loss characterization 314 can characterize loss, diffusion, or a combination thereof for cells within the memory array 110 after the corresponding portion of the memory array 110 has aged with a predetermined amount of time, usage, or a combination thereof. The aged loss characterization 314 can correspond to specific values of the predetermined amount of time, usage, or a combination thereof.

The aged loss characterization 314 can correspond to the aged distribution 310 changed over the specified duration. The method of measurement, the method of calculation, the specified duration or time periods, or a combination thereof for the initial loss characterization 312, the aged loss characterization 314, or a combination thereof can be predetermined by the non-volatile memory system 100 of FIG. 1, software manufacturer, hardware manufacturer, or a combination thereof.

The charge distribution profile 302 can have multiple instances of the aged loss characterization 314 each corresponding to different values of the predetermined amount of time, usage, or a combination thereof. The charge distribution profile 302 can also have a predetermined equation or method for calculating the aged loss characterization 314 based on the initial distribution 308, aged based on amount of time, usage, or both, or a combination thereof.

The initial loss characterization 312 and the aged loss characterization 314 can be represented by straight lines extending downward and to the left from top left portions of the initial distribution 308 and the aged distribution 310, respectively. The initial loss characterization 312 can have a higher slope and a higher maximum value than the aged loss characterization 314.

The higher slope and the higher maximum value can have the initial loss characterization 312 closer to the charge distribution profile 302 than the aged loss characterization 314 is to the aged distribution 310. As the memory array 110 ages, charges retained over a period of time can spread out over a wider physical area in the memory array 110, as characterized by the differences in the slopes and the maximum values.

The charge distribution profile 302 can have a read threshold 316. The read threshold 316 is defined as a level for comparing the charge level to identify the information stored in the memory array 110. The read threshold can be a voltage level limit for identifying the contents of a cell as a specific bit or a specific combination of bits. The read threshold 316 can be shifted on the charge distribution profile 302 for measuring the measured effective life 114 of FIG. 1, as shown in FIG. 3. Details regarding shifting the read threshold 316 and the use thereof will be described below.

The charge distribution profile 302 can have the read threshold 316 adjusted to various levels. The charge distribution profile 302 can have an initial threshold level 318 and a test threshold level 320 for the read threshold 316.

The initial threshold level 318 is defined as a level or a value of the read threshold 316 before the non-volatile memory system 100 generates the test stimulus 118 of FIG. 1.

The initial threshold level 318 can be specified for measuring an attribute of the memory array 110 to calculate the measured effective life 114.

For example, the initial threshold level 318 can be the voltage level of the read threshold 316 yielding a specified value of an error measurement. Also for example, the initial threshold level 318 can be a value representing an amount of charge for the read threshold 316 that minimizes the error measurement. For further example, the initial threshold level 318 can be a fixed level for the read threshold 316 within the memory array 110. Details regarding the determination and the use of the initial threshold level 318 will be discussed below.

The test threshold level 320 is defined as a level or a value of the read threshold 316 after the non-volatile memory system 100 generates the test stimulus 118. The test threshold level 320 can be specified for measuring the attribute of the memory array 110 or the test response 116 of FIG. 1 to calculate the measured effective life 114.

For example, the non-volatile memory system 100 can adjust the read threshold 316 to determine the test threshold level 320 for yielding specific error measurement. Also for example, the test threshold level 320 can be a voltage level of the read threshold 316 for minimizing the error measurement after a specified time delay. For further example, the test threshold level 320 can be a fixed level different from, related to, or a combination of relationships thereof to the initial threshold level 318. Details regarding the determination and the use of the initial threshold level 318 will be discussed below.

It has been discovered that the charge distribution profile 302 can provide accurate estimation of the age of the memory array 110. The charge distribution profile 302 can provide accurate estimation by enabling measurement of attributes of the memory array 110 for calculating and estimating the measured effective life 114.

It has also been discovered that the charge distribution profile 302 having the initial distribution 308, the aged distribution 310, the initial loss characterization 312, and the aged loss characterization 314, or a corresponding equation or determination method prolongs the use of the memory array 110. The charge distribution profile 302 can prolong the user of the memory array 110 by accurately identifying the age or capabilities of the portions, which increases the effectiveness of wear-leveling management for the memory array 110.

Figure 4:
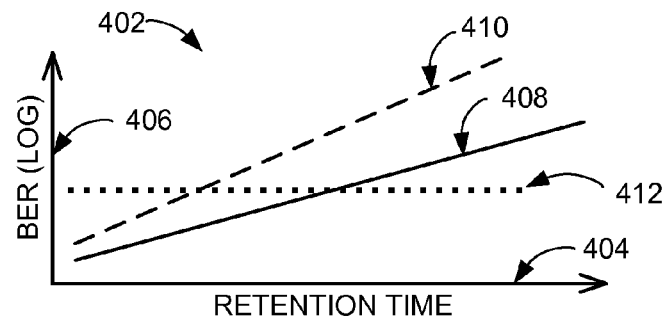
FIG. 4 is a further example of the test response of FIG. 1.

Referring now to FIG. 4, therein is shown a further example of the test response 116 of FIG. 1. The test response 116 can be characterized by an error profile 402. The error profile 402 is defined as characterization of changes in error rates relative to various durations of charge retention over a predetermined amount of time, usage, or a combination thereof. The error profile 402 can have various error rates corresponding to different retention times for a specific value of the predetermined age based on an amount of time, usage, or a combination thereof.

The error profile 402 can be specific to a given temperature. The bit error rate relative to retention duration can change based on the temperature of the memory array 110 of FIG. 1.

The error profile 402 can have a retention time axis 404 and an error rate axis 406. The retention time axis 404 can have a linear or a logarithmic scale. The retention time axis 404 can extend along a horizontal direction. The error rate axis 406 can have a linear or a logarithmic scale. The error rate axis 406 can extend along a vertical direction.

The error profile 402 can have an initial error-characterization 408 and an aged error-characterization 410. The initial error-characterization 408 is defined as characterization of bit error rates relative to charge retention time when the portion of the memory array 110 is in ideal condition.

The initial error-characterization 408 can be characterization of the designed capacity or ideal behavior of the circuits within the memory array 110. For example, the initial error-characterization 408 can be a designed or an ideal bit error rates related to read or write operations for transistors in the memory array 110.

The initial error-characterization 408 can be calculated using the initial limitations or behavior of the material or components in the circuitry of the memory array 110. The initial error-characterization 408 can also be measured or provided by the manufacturer.

The aged error-characterization 410 is defined as characterization of changes in bit error rates as the corresponding portions of the memory array 110 ages over a predetermined amount of time, usage, or a combination thereof. The error profile 402 can have the aged error-characterization 410 corresponding to a specific value of age based on predetermined amount of time, usage, or a combination thereof.

The error profile 402 can further have multiple instances of the aged error-characterization 410 each corresponding to different values of the predetermined amount of time, usage, or a combination thereof. The error profile 402 can also have a predetermined equation or method for calculating the aged error-characterization 410 based on the initial error-characterization 408, aged based on amount of time, usage, or both, or a combination thereof.

The initial error-characterization 408 and the aged error-characterization 410 can be represented as a straight line when the error rate axis 406 uses logarithmic scales. The initial error-characterization 408 can have lower error rates and lower slope than the aged error-characterization 410. As the memory array 110 ages, the error rates can increase for a given period of retention time, as characterized by the higher error rates and the higher slope for the aged error-characterization 410. The change in error rate can be caused by the change in charge distribution as characterized by the charge distribution profile 302 of FIG. 3.

The error profile 402 can further have a predetermined error rate 412. The predetermined error rate 412 can be a specified value for an error measurement. The predetermined error rate 412 can be the specified value for the initial error-characterization 408, the aged error-characterization 410, or a combination thereof.

The non-volatile memory system 100 of FIG. 1 can use the predetermined error rate 412 for calculating the measured effective life 114 of FIG. 1. The predetermined error rate 412 can be predetermined and stored in the memory array 110, the processing device 104 of FIG. 1, the memory controller 112 of FIG. 1, or a combination thereof by the non-volatile memory system 100, the hardware manufacturer, the software manufacturer, or a combination thereof. Details regarding the use of the use of the predetermined error rate 412 will be discussed below.

For illustrative purposes the error profile 402 is shown as indicating the bit error rate in reference to the retention time. However, it is understood that the error profile 402 can be more complex and have the bit error rate in reference to other factors. For example, the error profile 402 can indicate the bit error rate corresponding to the retention time, different locations or levels for the read threshold 316 of FIG. 3, different values for the measured effective life 114 for the corresponding hardware, or a combination thereof.

It has been discovered that the error profile 402 can provide accurate estimation of the age of the memory array 110. The error profile 402 can provide accurate estimation by enabling measurement of attributes of the memory array 110 for calculating and estimating the measured effective life 114.

It has also been discovered that the error profile 402 having the initial error-characterization 408, the aged error-characterization 410, or a corresponding equation or determination method prolongs the use of the memory array 110. The error profile 402 can prolong the user of the memory array 110 by accurately identifying the age or capabilities of the portions, which increases the effectiveness of wear-leveling management for the memory array 110.

It has further been discovered that the error profile 402 provides up-to-date accurate tracking of the age or capabilities of the memory array 110. The error profile 402 provides up-to-date accurate tracking by enabling the non-volatile memory system 100 to dynamically measure and calculate the effective age or capabilities of the memory array 110, which allows adjustments for unexpected failures or initial measurement or calculation errors.

Figure 5:
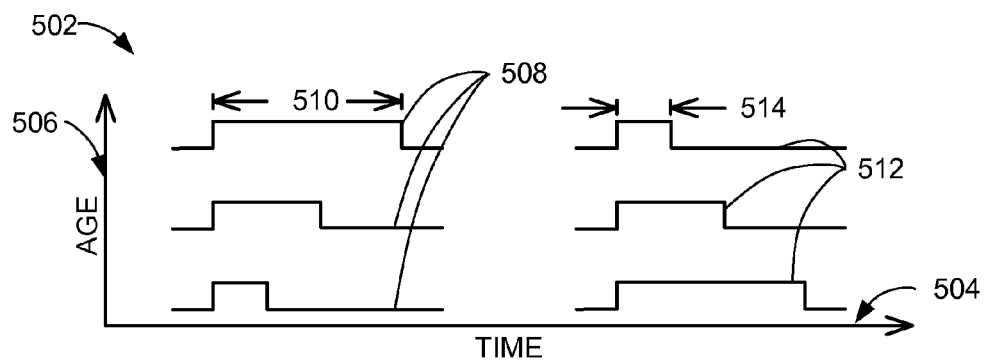
FIG. 5 is yet a further example of the test response of FIG. 1.

Referring now to FIG. 5, therein is shown yet a further example of the test response 116 of FIG. 1. The test response 116 can be characterized by an execution profile 502. The execution profile 502 is defined as a characterization of the change in amount of time required to complete various operations. For example, the execution profile 502 can characterize the change in amount of time required to complete an erase operation, a write operation, or a combination thereof as the memory array 110 of FIG. 1 ages.

The execution profile 502 can have a time axis 504 for representing duration of time spent or required for executing a command such as write or erase. The time axis 504 can extend along a horizontal direction.

The execution profile 502 can have an age axis 506 for representing an age based on time or usage of portions of the memory array 110. The age axis 506 can extend along a vertical direction. The age of the memory array 110 can be represented as increasing along an upward direction of the age axis 506.

The execution profile 502 can have an erase-response 508. The erase-response 508 is defined as a signal or notification given to indicate that the erase block 204 of FIG. 2 is being erased. The erase-response 508 can be a status or busy signal or indication responding to an erase command executed through the memory controller 112 of FIG. 1 for the erase block 204 in the memory array 110.

The erase-response 508 can have an erase-duration 510. The erase-duration 510 is defined as an amount of time spent performing the erase command on the erase block 204 as indicated by the erase-response 508. For example, the erase-duration 510 can be the duration between indications signifying that the erase command is being executed or a pulse width of a busy signal.

As the memory array 110 ages the amount of time required to complete an erase command can increase. The execution profile 502 can characterize the change by having various values of the erase-response 508 each with different values of the erase-duration 510 corresponding to various ages based on time, usage, or a combination thereof. The erase-response 508 can also characterize the change with an equation or a predetermined method and various ages based on time, usage, or a combination thereof.

The execution profile 502 can have a write-response 512. The write-response 512 is defined as a signal or notification given to indicate that the page 202 of FIG. 2 is being written. The write-response 512 can be a status or busy signal or indication responding to a write command executed through the memory controller 112 for the page 202 in the memory array 110.

The write-response 512 can have a program-duration 514. The program-duration 514 is defined as an amount of time spent performing the write command on the erase block 204 as indicated by the write-response 512. For example, the program-duration 514 can be the duration between indications signifying that the write command is being executed or a pulse width of a busy signal.

As the memory array 110 ages the amount of time required to complete a write command can decrease. The execution profile 502 can characterize the change by having various values of the write-response 512 each with different values of the program-duration 514 corresponding to various ages based on time, usage, or a combination thereof. The write-response 512 can also characterize the change with an equation or a predetermined method and various ages based on time, usage, or a combination thereof.

It has been discovered that the execution profile 502 can provide accurate estimation of the age of the memory array 110. The execution profile 502 can provide accurate estimation by enabling measurement of attributes of the memory array 110 for calculating and estimating the measured effective life 114 of FIG. 1.

It has also been discovered that the execution profile 502 having the erase-response 508 with the erase-duration 510, the write-response 512 with the program-duration 514, or a corresponding equation or determination method prolongs the use of the memory array 110. The execution profile 502 can prolong the user of the memory array 110 by accurately identifying the age or capabilities of the portions, which increases the effectiveness of wear-leveling management for the memory array 110.

It has further been discovered that the execution profile 502 provides up-to-date accurate tracking of the age or capabilities of the memory array 110. The execution profile 502 provides up-to-date accurate tracking by enabling the non-volatile memory system 100 of FIG. 1 to dynamically measure and calculate the effective age or capabilities of the memory array 110, which allows adjustments for unexpected failures or initial measurement or calculation errors.

Figure 6:
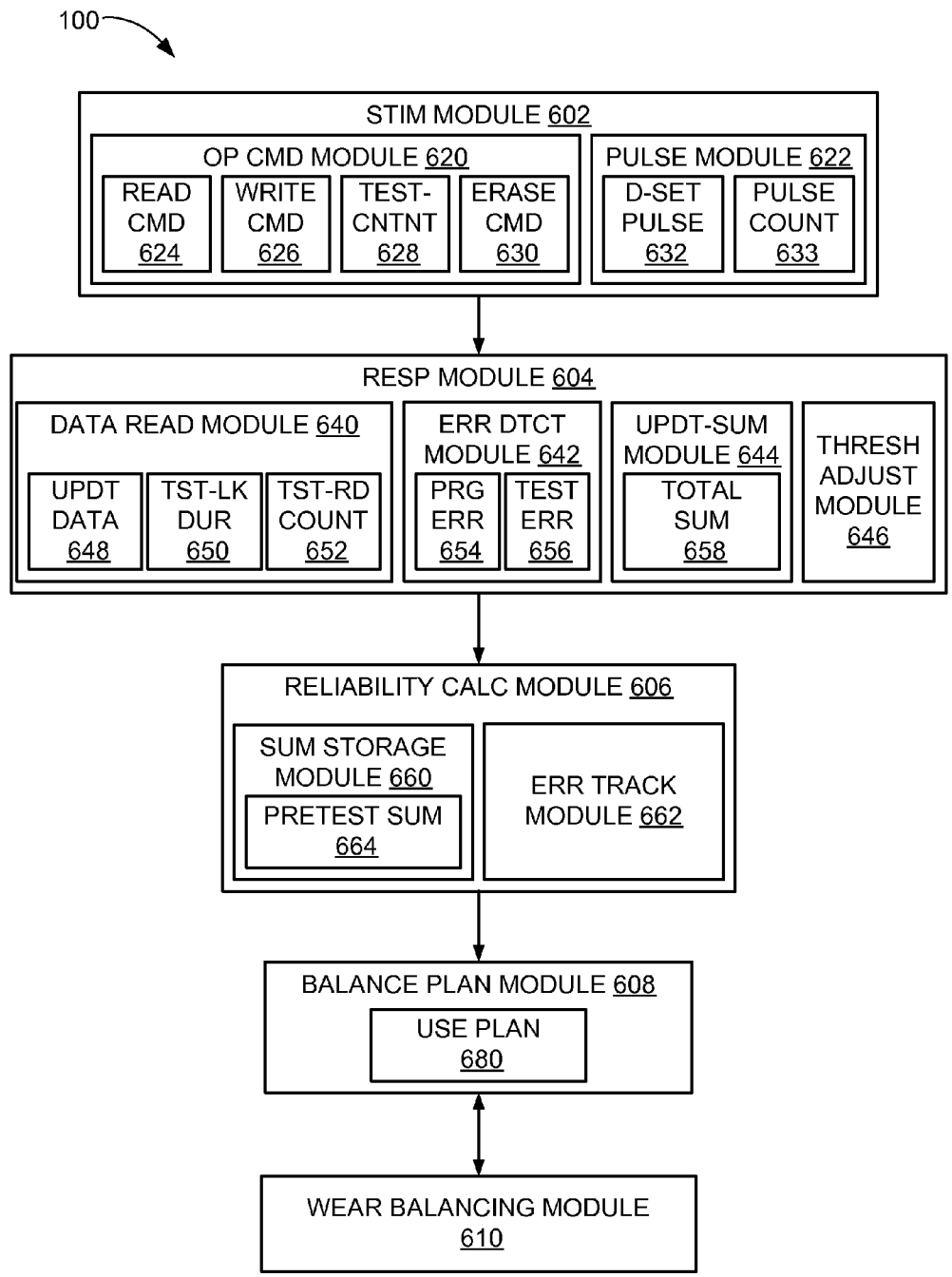
FIG. 6 is an operational flowchart of the non-volatile memory system with block-life measurement mechanism.

Referring now to FIG. 6, therein is shown an operational flowchart of the non-volatile memory system 100 with block-life measurement mechanism. The non-volatile memory system 100 can have a stimulus module 602, a response module 604, a reliability calculation module 606, a balance plan module 608, and a wear balancing module 610.

The stimulus module 602 can be connected to the response module 604. The response module 604 can be connected to the reliability calculation module 606. The reliability calculation module 606 can be connected to the balance plan module 608. The balance plan module 608 can be connected to the wear balancing module 610.

The stimulus module 602 is for controlling and testing the memory array 110 of FIG. 1. The stimulus module 602 can use the memory controller 112 of FIG. 1, the processing device 104 of FIG. 1, portions of the memory array 110, or a combination thereof to generate the test stimulus 118 of FIG. 1 for the memory array. The stimulus module 602 can have an operational command module 620 and a pulse module 622 for generating the test stimulus 118.

The operational command module 620 is for generating the test stimulus 118 by processing commands related to operations of the storage device 102 of FIG. 1. The operational command module 620 can process commands for reading, writing, and erasing of the data content 111 of FIG. 1 of the memory array 110.

For calculating the measured effective life 114 of FIG. 1 based on measurements, the operational command module 620 can generate the commands by initiating the processing of commands related to operations. The operational command module 620 can also generating the test stimulus 118 by using commands sent by the processing device 104 to initiate other measurement process, calculation process, or a combination thereof for calculating the measured effective life 114 along with processing the commands. The operational command module 620 can process the commands by forming a path, sending signals, receiving signals, or a combination thereof.

For example, the memory controller 112 can have sequences of operations for reading, writing, or erasing data in the memory array 110. The processing device 104 can send commands to initiate the sequences of operations. For calculating the measured effective life, the operational command module 620 can have the memory controller 112 initiate the processing, or the sequences of operations, without the direct commands for reading, writing, or erasing data from the processing device 104.

Also for example, the operational command module 620 can also initiate separate sequences of operations based on commands from the processing device 104. The operational command module 620 can trigger the sequence of measurements and calculations based on commands sent for other unrelated purposes.

The operational command module 620 can use the memory controller 112 to process a read command 624 for reading one or more instances of the page 202 of FIG. 2. The operational command module 620 can also process a write command 626 for writing to one or more instances of the page 202. The operational command module 620 can have test-content 628 as a known set of control data for use as an input for measuring and calculating the measured effective life 114. The operational command module 620 can further process an erase command 630 for erasing data in one or more instances of the erase block 204 of FIG. 2, the super-block 206 of FIG. 2, or a combination thereof.

The pulse module 622 is for generating the test stimulus 118 by controlling a process or a set of signals to the memory array 110. The pulse module 622 can send data-setting pulses 632 for setting bits high or low.

The data-setting pulses 632 can be sent by the memory controller 112, portions of the memory array 110, or a combination thereof. The data-setting pulses 632 can be used the set the data content 111 high or low. A writing operation following an instance of the write command 626 can the data-setting pulses 632, each followed by a verification process, until intended information is stored in the memory array 110.

The pulse module 622 can generate the test stimulus 118 for measuring an attribute of the memory array 110 to calculate the measured effective life 114. The pulse module 622 can introduce the test stimulus 118 by sending the data-setting pulses 632 controlled by a pulse count 633 for setting the data content 111 high, low, or combination thereof in the memory array 110.

The pulse module 622 can limit the instances of the data-setting pulses 632 to the pulse count 633 during the writing process following the write command 626. The limited number of the data-setting pulses 632 can leave the intended writing process incomplete. The non-volatile memory system 100 can read, analyze, or combination thereof regarding the result of the data-setting pulses 632 limited to the pulse count 633 to measure the test response 116 of FIG. 1. The non-volatile memory system 100 can compare the result of the data-setting pulses 632 limited to the pulse count 633 to the intended data to calculate the measured effective life 114.

For example, the pulse module 622 can generate the test stimulus 118 by limiting the number of the data-setting pulses 632 to the pulse count 633, such as a number from 1 to 20, in response to the write command 626. The write command 626 can set all of data in the page 202 or multiple instances of the page to 1 or 0 as the intended data. The write command 626 can also have the test-content 628 as the intended data.

Continuing with the example, the response module 604 can read, sum, or both the data content 111 following instances of the data-setting pulses 632 limited to the pulse count 633 to measure the test response 116. The reliability calculation module 606 can calculate a difference between the data content 111 and the test-content 628 or between sums of two sets of data. The reliability calculation module 606 can use the difference between the two data sets or between the sums thereof as an input to an equation or a look-up table to calculate the measured effective life 114 corresponding to the difference.

Continuing with the example, the equation, the look-up table, the process, or a combination thereof for calculating the measured effective life 114 can be based on the charge distribution profile 302 of FIG. 3, the error profile 402 of FIG. 4, the execution profile 502 of FIG. 5, or a combination thereof. The equation, the look-up table, the process, or a combination thereof can also be predetermined by the non-volatile memory system 100, the hardware manufacturer, the software manufacturer, or a combination thereof.

The service life of hardware components within the memory array 110 is effectively over when the data content 111 cannot be sustained according to retention requirements of the storage device 102. By estimating the rate of charge flow through the insulator for a known perturbation, such as by limiting the number of the data-setting pulses 632, an effective age of the hardware components, such as for the page 202 or the erase block 204, within the memory array 110 can be measured. Charge programmed onto floating gates leaks very slowly at the beginning of life and much more rapidly at end of life.

It has been discovered that the data-setting pulses 632 controlled by the pulse count 633 provide accurate calculation of the measured effective life 114, which extends the life of the storage device 102. Limiting the number of the data-setting pulses 632 enable the accurate calculation by limiting the opportunity to write, which will affect the portions of the memory array 110 having aged components. As the memory array 110 ages, the data in the memory array 110 will be more susceptible to changing based on less instances of the data-setting pulses 632, which can be used to accurately calculate the age of the memory array 110 or the portions therein.

The response module 604 is for determining a status of the memory array 110. The response module can use the processing device 104, the memory controller 112, portions of the memory array 110, or a combination thereof to measure the test response 116 from the memory array 110 based on the test stimulus 118.

The response module 604 can measure the test response 116 by accessing the data content 111 of the memory array 110 to measure attributes of the memory array 110, including determining error related parameters, summing the data content 111, adjusting thresholds, or a combination thereof. The response module 604 can have a data read module 640, an error detection module 642, an updated-sum module 644, and a threshold adjustment module 646 for measuring the test response 116.

The data read module 640 is for accessing the data content 111 stored in the memory array 110. The data read module 640 can use the memory controller 112 to perform the operations related to the read command 624 in accessing the data content 111.

The data read module 640 can read the data content 111 stored in the memory array 110 for measuring attributes thereof to calculate the measured effective life 114. The data read module 640 can read the data content 111, including updated data 648, in response to the test stimulus 118, such as the write command 626 or the data-set pulse 632. The updated data 648 can be the data content 111 updated in the memory array 110 following the operational command, including the test stimulus 118, and the subsequent operations of the memory controller 112, the memory array 110, or a combination thereof.

The data read module 640 can also have a test-leakage duration 650 stored therein. The test-leakage duration 650 is defined as a period of time allowing for the charge to leak out of portions within the memory array 110. The test-leakage duration 650 can be predetermined by the non-volatile memory system 100, a manufacturer for the memory array 110, a manufacturer for the processing device 104, or a combination thereof. The data read module 640 can read the data content 111 after waiting per the test-leakage duration 650 for calculating the measured effective life 114.

The data read module 640 can further have a test-read count 652 stored therein. The test-read count 652 is defined as a number for repeating the read operation for calculating the measured effective life 114. The test-read count 652 can be predetermined by the non-volatile memory system 100, a manufacturer for the memory array 110, a manufacturer for the processing device 104, or a combination thereof.

The data read module 640 can also receive operational signals from the memory array 110. The data read module 640 can measure the test response 116 by receiving the operational signals.

For example, the data read module 640 can receive the erase-response 508 of FIG. 5 having the erase-duration 510 of FIG. 5 for indicating an amount of time spent by the memory array 110 to erase data therein. The data read module 640 can measure the test response 116 by receiving the erase-response 508 and determining the erase-duration 510.

Also for example, the data read module 640 can receive the write-response 512 of FIG. 5 having the program-duration 514 of FIG. 5 for indicating an amount of time spent by the memory array 110 to write data into the memory array 110. The data read module 640 can measure the test response 116 receiving the write-response 512 and determining the program-duration 514.

The error detection module 642 is for calculating error related parameters related to the operational commands. The error detection module 642 can determine a programming error rate 654, a test error rate 656, or a combination thereof.

The programming error rate 654 is defined as the amount or frequency of bit error related to operations such as read, write, erase, or a combination thereof under normal operating instances for the storage device 102. The test error rate 656 is defined as the amount or frequency of bit error related to operations under an instance of operations for measuring attributes to calculate the measured effective life 114. The error detection module 642 can determine the programming error rate 654, the test error rate 656, or a combination thereof corresponding to the read command 624.

For example, the error detection module 642 can determine the programming error rate 654 each time the read command 624 is processed or the test error rate 656 each time the measured effective life 114 is being calculated. Also for example, the error detection module 642 can determine the test error rate 656 while the memory controller 112, a portion of the memory array 110, or a combination thereof repeatedly reads an instance of the page 202 according to the test-read count 652 for measuring attributes to calculate the measured effective life 114.

The updated-sum module 644 is for calculating a total sum 658 of the updated data 648. The updated-sum module 644 can perform a sum of all the bits stored in each of the page 202 each time a read, a write, or an erase is performed. The sum can be a sum of all bits or words according to a predetermined summing method or equation as set by the non-volatile memory system 100, a manufacturer for the memory array 110, a manufacturer for the processing device 104, or a combination thereof.

The threshold adjustment module 646 is for adjusting thresholds for measuring attributes of the memory array 110 to calculate the measured effective life 114. The threshold adjustment module 646 can shift the read threshold 316 of FIG. 3, such as from a central portion to the left, for reading data from the memory array 110. The threshold adjustment module 646 can shift the read threshold 316 by a predetermined shift amount and direction, as determined by the non-volatile memory system 100, a manufacturer for the memory array 110, a manufacturer for the processing device 104, or a combination thereof.

Shifting the read threshold 316 can change the test error rate 656 based on the charge distribution as characterized by the charge distribution profile 302. As characterized by the charge distribution profile 302, the test error rate 656 will increase as the memory array 110 ages for same amount of shift in the read threshold 316. Thus, the test error rate 656, the read threshold 316 shifted by the predetermined shift amount, the error profile 402, or a combination thereof can be used to calculate the measured effective life 114.

For example, the threshold adjustment module 646 can adjust or shift the read threshold 316 for reading the data content 111 from the memory array 110. The data read module 640 can introduce a read-disturb as the test stimulus 118 by repeatedly reading one or multiple instances of the page 202 according to the test-read count 652. The error detection module 642 can measure the test response 116 by determining the test error rate 656 after the repeated reads.

Continuing with the example, the reliability calculation module 606 can calculate a difference between the test error rate 656 and a previously measured instance of the programming error rate 654. The reliability calculation module 606 can use the difference between the two error rates as an input to an equation or a look-up table to calculate the measured effective life 114 corresponding to the difference.

Continuing with the example, the equation, the look-up table, the process, or a combination thereof for calculating the measured effective life 114 can be based on the charge distribution profile 302, the error profile 402, the execution profile 502, or a combination thereof. The equation, the look-up table, the process, or a combination thereof can also be predetermined by the non-volatile memory system 100, the hardware manufacturer, the software manufacturer, or a combination thereof.

It has been discovered that the test error rate 656, the read threshold 316 shifted by the predetermined shift amount, and the error profile 402 provide accurate calculation of the measured effective life 114, which extends the life of the storage device 102. The combination of the test error rate 656, the read threshold 316 shifted by the predetermined shift amount, and the error profile 402 provide accurate calculation by enabling a measurement of the effective age of the memory array 110.

After the test response 116 is measured, the response module 604 can pass the programming error rate 654, the total sum 658, other measured attributes, or a combination thereof to the reliability calculation module 606. The reliability calculation module 606 is for calculating the measured effective life 114. The reliability calculation module 606 can also store the programming error rate 654, the total sum 658, or a combination thereof.

The reliability calculation module 606 can have a sum storage module 660 and an error tracking module 662 both for storing measured attributes. The sum storage module 660 is for storing a pretest sum 664. The sum storage module 660 can store the pretest sum 664 by assigning the value of the total sum 658 as the value of the pretest sum 664. The pretest sum 664 can be used by the reliability calculation module 606 for comparison with the total sum 658 resulting from a measurement of attributes. The error tracking module 662 is for storing the programming error rate 654.

The reliability calculation module 606 can calculate the measured effective life 114 from the test response 116 for indicating reliability and capability of the memory array 110. The reliability calculation module 606 can calculate the measured effective life 114 using the test response 116, the charge distribution profile 302, the error profile 402, the execution profile 502, or a combination thereof.

The reliability calculation module 606 can calculate the measured effective life 114 using the error profile 402, the charge distribution profile 302, the programming error rate 654, the test error rate 656, or a combination thereof. The reliability calculation module 606 can also use the charge distribution profile 302, the test content 628 and the data stored in the memory array 110, the pretest sum 664 and the total sum 658, or a combination thereof. The reliability calculation module 606 can further use the execution profile 502 and the erase-duration 510, the program-duration 514, or a combination thereof.

For example, the reliability calculation module 606 can calculate the measured effective life 114 by matching the test error rate 656 to a corresponding value of age on the error profile 402. The reliability calculation module 606 can further calculate or refine the measured effective life 114 using the relationship between age and various values of the test error rate 656 according to the charge distribution profile 302. The reliability calculation module 606 can also calculate the measured effective life 114 by comparing the test error rate 656 to the programming error rate 654.

It has been discovered that the test error rate 656, the programming error rate 654, the error profile 402, and the charge distribution profile 302 provide up-to-date accurate tracking of the age or capabilities of the memory array 110. The test error rate 656, the programming error rate 654, the error profile 402, and the charge distribution profile 302 provide up-to-date accurate tracking by enabling the non-volatile memory system 100 to dynamically measure and calculate the measured effective life 114, which allows adjustments for unexpected failures or initial measurement or calculation errors.

Also for example, the reliability calculation module 606 can calculate the measured effective life 114 by comparing the pretest sum 664 and the total sum 658 in response to the data-set pulse 632. The reliability calculation module 606 can also calculate the measured effective life 114 by comparing the pretest sum 664 and the total sum 658 determined after waiting the test-leakage duration 650 to measure the leakage amount. The reliability calculation module 606 can further calculate the measured effective life 114 by writing the test content 628, waiting the test-leakage duration 650 and comparing the data content 111 resulting in the memory array 110.

It has been discovered that the pretest sum 664, the total sum 658, the test-leakage duration 650, the error profile 402, and the charge distribution profile 302 provide up-to-date accurate tracking of the age or capabilities of the memory array 110. The pretest sum 664, the total sum 658, the test-leakage duration 650, the error profile 402, and the charge distribution profile 302 provide up-to-date accurate tracking by enabling the non-volatile memory system 100 to dynamically measure and calculate the measured effective life 114, which allows adjustments for unexpected failures or initial measurement or calculation errors.

For further example, the reliability calculation module 606 can calculate the measured effective life 114 by comparing the erase-duration 510, the program-duration 514, or a combination thereof to the execution profile 502. For all examples, the reliability calculation module 606 can calculate the measured effective life 114 by matching the test response 116 to a value in a corresponding profile and assigning the corresponding age value as the measured effective life 114. The reliability calculation module 606 can also use predetermined methods or equations to calculate the measured effective life 114 using the test response 116 and the corresponding profile as inputs.

It has been discovered that the error profile 402, the erase-duration 510, and the program-duration 514 provide up-to-date accurate tracking of the age or capabilities of the memory array 110. The error profile 402, the erase-duration 510, and the program-duration 514 provide up-to-date accurate tracking by enabling the non-volatile memory system 100 to dynamically measure and calculate the measured effective life 114, which allows adjustments for unexpected failures or initial measurement or calculation errors.

In another example, the reliability calculation module 606 can calculate a difference between the data content 111 and the test-content 628 or between the total sum 658 and the pretest sum 664. The reliability calculation module 606 can use the difference as an input to an equation or a look-up table to calculate the measured effective life 114 corresponding to the difference.

In yet a further example, the reliability calculation module 606 can use the difference between the programming error rate 654 and the test error rate 656 as an input to an equation or a look-up table to calculate the measured effective life 114 corresponding to the difference. The reliability calculation module 606 can use the difference as an input to an equation or a look-up table to calculate the measured effective life 114 corresponding to the difference.

The equation, the look-up table, the process, or a combination thereof for calculating the measured effective life 114 can be based on the charge distribution profile 302, the error profile 402, the execution profile 502, or a combination thereof. The equation, the look-up table, the process, or a combination thereof can also be predetermined by the non-volatile memory system 100, the hardware manufacturer, the software manufacturer, or a combination thereof.

The reliability calculation module 606 can pass the measured effective life 114 to the balance plan module 608. The balance plan module 608 is for determining a use plan 680 for balancing usage of the memory array according to the measured effective life. The balance plan module 608 can determine the use plan 680 by storing the measured effective life 114 in the corresponding instance of the statistical data 210 of FIG. 2. The statistical data 210 can be used to perform wear-leveling for managing the memory array 110.

The balance plan module 608 can also determine the use plan 680 by forming the super-block 206. The balance plan module 608 can form the super-block 206 by grouping the instances of the erase block 204 having the same or similar values of the measured effective life 114. The grouping of the super-block 206 can be used for erasing and recycling data during wear-leveling.

The wear balancing module 610 is for performing the wear-leveling process. The wear balancing module 610 can use the memory controller 112, portions of the memory array 110, or a combination thereof to manage the usage of the memory array 110 according the use plan 680 for performing wear-leveling.

The wear balancing module 610 can perform wear-leveling by tracking the statistical data 210, such as the erase count 212 of FIG. 2, the write count 214 of FIG. 2, the read count 216 of FIG. 2, or a combination thereof. The wear balancing module 610 can perform wear-leveling by keeping the values of the contents within the statistical data 210 relatively uniform across all instances of the page 202, all instances of the erase block 204, or a combination thereof within the memory array 110.

For example, the wear balancing module 610 can determine the internal location or address of a new instance of the data content 111 being written based on the measured effective life 114, the write count 214, or a combination thereof for an instance of the page 202. The instance of the page 202 within the memory array 110 having the greatest difference between the measured effective life 114 and the write count 214 can be used to store the new data content.

Also for example, the wear balancing module 610 can determine the internal location or address for recycling the data content 111 based on a combination of the erase count 212, the write count 214, the read count 216, and the measured effective life 114. The wear balancing module 610 can move the data content 111 of one instance of the super-block 206 to an instance of the super-block 206 having the greatest difference between the measured effective life 114 and a sum of the erase count 212, the write count 214, and the read count 216.

It has been discovered that measuring, calculating, and updating the measured effective life 114 during the recycling process provides effective data arrangement and improved efficiency. The measuring, calculating, and updating the measured effective life 114 during the recycling process can provide effective data arrangement and improved efficiency by storing the measured effective life 114 into a designated portion of the page 202 or the statistical data 210 immediately after the recycling process. By measuring the measured effective life 114 of blocks during recycling, only a very small percentage of the entire drive's erase block ages must be saved during an unexpected power loss.

The updated information in the statistical data 210 can be passed back to the balance plan module 608. The balance plan module 608 can use the updated information in the statistical data 210 to regroup instances of the erase block 204 and form new instances of the super-block 206 using methods similar to ones described above.

It has been discovered that the measured effective life 114 provides improved efficiency and reliability of the components within the storage device 102. The measured effective life 114 provides improved efficiency and reliability of the storage device 102 by enabling dynamic creations of the super-block 206 based on similar effective ages. This is most practically done by aggregating erase blocks from the recycling spare pool to create the super-block 206. By selecting like aged erase blocks, the total spread of erase block age across any super block is minimized.

Referring now to FIG. 7, therein is shown a detailed example flow within the response module 604 of FIG. 6. After the stimulus module 602 generates the test stimulus 118 of FIG. 1, the control can pass to the threshold adjustment module 646.

As an example method for measuring the test response 116 of FIG. 1, the threshold adjustment module 646 can use the memory controller 112 of FIG. 1, the processing device 104 of FIG. 1, portion of the memory array 110 of FIG. 1, or a combination thereof to adjust the read threshold 316 of FIG. 3. The read threshold 316 can be adjusted in various ways.

For example, the read threshold 316 can be adjusted to the left by a predetermined percentage, a predetermined distance, or a combination thereof from the initial threshold level 318 of FIG. 3 to the test threshold level 320 of FIG. 3. The initial threshold level 318 can be the level or the value of the read threshold 316 during normal read operations and the test threshold level 320 can be the adjusted level for measuring the test response 116.

Also for example, the threshold adjustment module 646 can interact with the error detection module 642 to adjust the read threshold 316 in either direction so that the programming error rate 654 of FIG. 6 is minimized or matches the predetermined error rate 412 of FIG. 4. The predetermined error rate 412 can be relatively higher values, such as between 1e-3 and 1e-6, corresponding to the read threshold 316 being located away from peaks as shown in the charge distribution profile 302 of FIG. 3.

Continuing with the example, the initial threshold level 318 can be set to the level of the read threshold 316 minimizing the programming error rate 654 or yielding the predetermined error rate 412 before the test stimulus 118. The read threshold 316 can be adjusted again after the test stimulus 118 to measure the test response 116 by determining the test threshold level 320 minimizing the error or yielding the predetermined error rate 412 after the test stimulus 118.

Continuing with the example, the initial threshold level 318 can be determined relatively early in the life or use of the storage device 102 of FIG. 1, having had minimal amount of disturbs or charge retention duration. The initial threshold level 318 and the resulting instance of the programming error rate 654 can be determined immediately after the data content 111 of FIG. 1 is written. With the time period between writing the data content 111 and the determination of the programming error rate 654 minimized, the programming error rate 654 at early point in the life or use of the storage device 102 can be an intrinsic error rate.

The percentage, distance, value, process, or a combination thereof for adjusting the read threshold 316 can be predetermined by the non-volatile memory system 100, a manufacturer for the memory array 110, a manufacturer for the processing device 104, or a combination thereof. The percentage, distance, value, process, or a combination thereof can be stored in the threshold adjustment module 646.

After the read threshold 316 is adjusted or as part of the adjustment process, the error detection module 642 can determine the programming error rate 654 as control data before the test stimulus 118. The data read module 640 can complete the generation of the test stimulus 118 by repeatedly reading one or more instances of the page 202 of FIG. 2 according to the test-read count 652 of FIG. 6. The repeated reads can inject a known controlled disturbance to the erase block 204 of FIG. 2 having one or more instances of the page 202. After the multiple reads, the error detection module 642 can measure the test response 116.

For example, the error detection module 642 can measure the bit error rate. The resulting measurement can be the test error rate 656 of FIG. 6 using the test threshold level 320 shifted by a predetermined amount from the initial threshold level 318 used for normal read operations. The error detection module 642 can pass the test error rate 656 and the programming error rate 654 as the test response 116 to the reliability calculation module 606.

Also for example, the error detection module 642 can also determine the test threshold level 320. The error detection module 642 can determine the test threshold level 320 minimizing the test error rate 656 or yielding the predetermined error rate 412. The error detection module 642 can pass the test error rate 656, the programming error rate 654, the initial threshold level 318, the test threshold level 320, or a combination thereof as the test response 116 to the reliability calculation module 606.

The reliability calculation module 606 can compare the test error rate 656 and the programming error rate 654, the initial threshold level 318 and the test threshold level 320, or a combination thereof. As the memory array 110 ages, the difference between the test error rate 656 and the programming error rate 654 and the difference in position between the initial threshold level 318 and the test threshold level 320 will increase using the above described method of measurement.

The reliability calculation module 606 can use a predetermined method, a predetermined equation, the charge distribution profile 302, the error profile 402 of FIG. 4, the execution profile 502 of FIG. 5, or a combination thereof for calculating the measured effective life 114 of FIG. 1. The predetermined method, the predetermined equation, the charge distribution profile 302, the error profile 402, the execution profile 502, or a combination thereof can be predetermined and stored in the reliability calculation module 606 by the non-volatile memory system 100, a manufacturer for the memory array 110, a manufacturer for the processing device 104, or a combination thereof.

The reliability calculation module 606 can use the difference between the test error rate 656 and the programming error rate 654 as an input for calculating the measured effective life 114. The reliability calculation module 606 can also use the difference between the initial threshold level 318 and the test threshold level 320, separately or along with the difference in error rates, as the input.

It has been discovered that the initial threshold level 318 for minimizing the programming error rate 654 and the test threshold level 320 for minimizing the test error rate 656 of FIG. 6 after the read-disturb provide accurate estimation of the reliability and the capability of the memory array 110. The initial threshold level 318 and the programming error rate 654 provide the accuracy by providing a way to quantize and measure the charge diffusion rate.

It has also been discovered that the initial threshold level 318 and the test threshold level 320 for yielding the predetermined error rate 412 after the read-disturb provide accurate estimation of the reliability and the capability of the memory array 110. The initial threshold level 318, the programming error rate 654, and the predetermined error rate 412 provide the accuracy by providing a way to quantize and measure the charge diffusion rate.

Referring now to FIG. 8, therein is shown a further detailed example flow within the response module of FIG. 6. After the stimulus module 602 generates the test stimulus 118 of FIG. 1, the control can pass to the threshold adjustment module 646.

As an example method for measuring the test response 116 of FIG. 1, the threshold adjustment module 646 can interact with the error detection module 642 to use the memory controller 112 of FIG. 1, the processing device 104 of FIG. 1, portion of the memory array 110 of FIG. 1, or a combination thereof to adjust the read threshold 316 of FIG. 3. The read threshold 316 can be adjusted in various ways.

For example, the read threshold 316 can be adjusted by a predetermined percentage, a predetermined distance, or a combination from the initial threshold level 318 of FIG. 3 to the test threshold level 320 of FIG. 3. The initial threshold level 318 can be the level or value of the read threshold during normal read operations and the test threshold level 320 can be the adjusted level or value for measuring the test response 116.

Also for example, the threshold adjustment module 646 can interact with the error detection module 642 to adjust the read threshold 316 in either direction so that the programming error rate 654 of FIG. 6 is minimized or matches the predetermined error rate 412 of FIG. 4. The predetermined error rate 412 can be relatively higher values, such as between 1e-3 and 1e-6, corresponding to the read threshold 316 being located away from peaks as shown in the charge distribution profile 302 of FIG. 3.

Continuing with the example, the initial threshold level 318 can be set to the value or the level of the read threshold 316 minimizing the programming error rate 654 or yielding the predetermined error rate 412 before the test stimulus 118. The read threshold 316 can be adjusted again after the test stimulus 118 to measure the test response 116 by determining the test threshold level 320 minimizing the error or yielding the predetermined error rate 412 after the test stimulus 118.

Continuing with the example, the initial threshold level 318 can be determined relatively early in the life or use of the storage device 102 of FIG. 1, having had minimal amount of disturbs or charge retention duration. The programming error rate 654 at early point in the life or use of the storage device 102 can be an intrinsic error rate. The adjustment of the read threshold 316 can be done immediately following the test stimulus 118. The adjustment of the read threshold 316 can be done right after writing an instance of the erase block 204 of FIG. 2.

After the combination of the threshold adjustment module 646 and the error detection module 642 adjusts the read threshold 316, the data read module 640 can use the test-leakage duration 650 to wait a predetermined amount of time after writing the block. The data read module 640 can perform a read after the test-leakage duration 650 or pass control flow to the threshold adjustment module 646.

The test response 116 can be measured after the delay using a variety of processes. For example, the error detection module 642 can measure the test error rate 656 using the test threshold level 320 shifted by a predetermined amount from the initial threshold level 318.

The test response 116 can also be measured with combination of the threshold adjustment module 646 and the error detection module 642 readjusting the read threshold 316. For example, the combination of the threshold adjustment module 646 and the error detection module 642 can adjust the read threshold 316 to determine the test threshold level 320 minimizing the test error rate 656 or yielding the predetermined error rate 412.

The test response can be the programming error rate 654, the test error rate 656, the initial threshold level 318, the test threshold level 320, or a combination thereof. As the memory array 110 ages, charges will leak faster. The increase in the charge flow rate results in the amount of shift in the read threshold 316 for minimizing the test error rate 656 or for yielding the predetermined error rate 412 to increase. The increase in the charge flow rate also results in increase in the differences between minimum error rates after the delay.

The combination of the data read module 640 and the threshold adjustment module 646 can pass the programming error rate 654, the test error rate 656, the initial threshold level 318, the test threshold level 320, or a combination thereof as the test response 116 to the reliability calculation module 606. The reliability calculation module 606 can use the test response 116 to calculate the measured effective life 114 of FIG. 1 using a variety of processes.

The reliability calculation module 606 can calculate a difference between the programming error rate 654 and the test error rate 656 measured after the test-leakage duration 650. The reliability calculation module 606 can also calculate a further difference between the initial threshold level 318 and the test threshold level 320. The reliability calculation module 606 can use the difference between the error rates, the further difference between the threshold levels, or a combination thereof as an input to calculate the measured effective life 114.

The reliability calculation module 606 can further use a predetermined method, a predetermined equation, the charge distribution profile 302 of FIG. 3, the error profile 402 of FIG. 4, the execution profile 502 of FIG. 5, or a combination thereof to calculate the measured effective life 114. The predetermined method, the predetermined equation, the charge distribution profile 302, the error profile 402, the execution profile 502, or a combination thereof can be predetermined and stored in the reliability calculation module 606 by the non-volatile memory system 100, a manufacturer for the memory array 110, a manufacturer for the processing device 104, or a combination thereof.

It has been discovered that the initial threshold level 318 for minimizing the programming error rate 654 and the test threshold level 320 for minimizing the test error rate 656 after the test-leakage duration 650 provide accurate estimation of the reliability and the capability of the memory array 110. The initial threshold level 318 and the programming error rate 654 provide the accuracy by providing a way to quantize and measure the charge diffusion rate.

It has also been discovered that the initial threshold level 318 and the test threshold level 320 for yielding the predetermined error rate 412 after the test-leakage duration 650 provide accurate estimation of the reliability and the capability of the memory array 110. The initial threshold level 318, the programming error rate 654, and the predetermined error rate 412 provide the accuracy by providing a way to quantize and measure the charge diffusion rate.

The various modules described above, such as the error detection module 642 of FIG. 6 or the reliability calculation module 606 of FIG. 6, can further be hardware implementation as one or more specialized hardware accelerators within the processing device 104 of FIG. 1, the memory controller 112 of FIG. 1, or both. The various modules can also be hardware implementation in the non-volatile memory system 100 or the storage device 102, outside of the processing device 104 and the memory controller 112.

Figure 9:
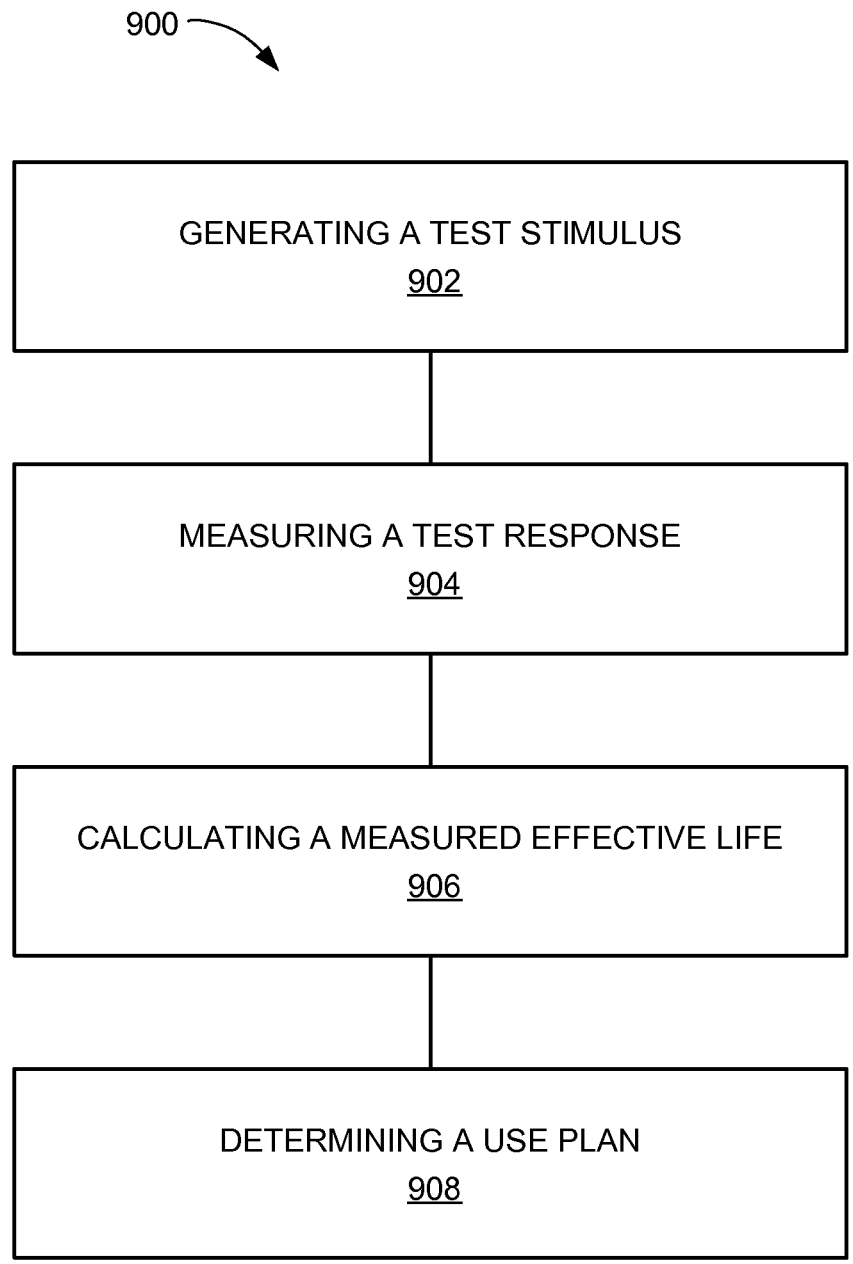
FIG. 9 is a flow chart of a method of operation of the non-volatile memory system in a further embodiment of the present invention.

Referring now to FIG. 9, therein is shown a flow chart of a method 900 of operation of a non-volatile memory management system in a further embodiment of the present invention. The method 900 includes: generating a test stimulus for a page in a memory array in a block 902; measuring a test response from the page in the memory array based on the test stimulus in a block 904; calculating a measured effective life of the page from the test response in a block 906; and determining a use plan according to the measured effective life for accessing the page in a block 908.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the non-volatile memory system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing non-volatile memory system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a non-volatile memory system comprising:
    generating a test stimulus for a page in a memory array;
    measuring a test response from the page in the memory array based on the test stimulus, the test response including a programming error rate or an erase-duration;
    calculating a measured effective life of the page in accordance with the programming error rate or the erase-duration; and
    determining a use plan according to the measured effective life for accessing the page.

2. The method as claimed in claim 1, wherein the method includes:
    storing the programming error rate from reading the page in the memory array; and
    shifting a read threshold for reading data content from the memory array;
    wherein:
        generating the test stimulus includes reading the page according to a test-read count;
        measuring the test response includes determining a test error rate after reading the page according to the test-read count; and
        calculating the measured effective life includes calculating the measured effective life using the programming error rate, the test error rate, or both.

3. The method as claimed in claim 1 further comprising:
    storing a pretest sum of data content stored in the memory array;
    wherein:
        generating the test stimulus includes sending data-setting pulses controlled by a pulse count for setting the data content high in the memory array;
        measuring the test response includes:
            reading updated data stored in the memory array in response to the data-setting pulses;
            calculating a total sum of the updated data; and
            calculating the measured effective life includes calculating the measured effective life using the total sum of the updated data stored in the memory array and the pretest sum.

4. The method as claimed in claim 1, wherein the method includes:
    determining an initial threshold level minimizing a programming error rate; and
    wherein:
        generating the test stimulus includes processing a read command after a test-leakage duration;
        measuring the test response includes determining a test threshold level minimizing a test error rate; and
        calculating the measured effective life includes calculating the measured effective life using the programming error rate, the test error rate, the initial threshold level, the test threshold level, or a combination thereof.

5. The method as claimed in claim 1 wherein:
    generating the test stimulus includes processing an erase command;
    measuring the test response includes receiving an erase-response having the erase-duration for indicating an amount of time spent by the memory array to erase data content in the memory array; and
    calculating the measured effective life includes calculating the measured effective life using the erase-duration.

6. A method of operation of an entertainment system comprising:
    generating a test stimulus for a page, an erase block, or a combination thereof in a memory array;
    measuring a test response from the page, the erase block, or the combination thereof in the memory array based on the test stimulus, the test response including a programming error rate or an erase-duration;
    calculating a measured effective life of the page, the erase block, or the combination thereof in accordance with the programming error rate or the erase-duration;
    determining a use plan for balancing usage of the page, the erase block, or a combination thereof according to the measured effective life relative to the memory array; and
    managing the usage of the memory array according the use plan for performing wear-leveling.

7. The method as claimed in claim 6 further including:
    determining an initial threshold level for yielding a predetermined error rate;
    wherein:
        generating the test stimulus includes reading the page according to a test-read count;
        measuring the test response includes determining a test threshold level for yielding the predetermined error rate after reading the page according to the test-read count; and
        calculating the measured effective life includes calculating the measured effective life using the initial threshold level, the test threshold level, or both.

8. The method as claimed in claim 6 further including:
    determining the programming error rate from reading the page in the memory array;
    determining an initial threshold level for minimizing the programming error rate;
    wherein:
        generating the test stimulus includes reading the page according to a test-read count;

measuring the test response includes:
  determining a test error rate after reading the page according to the test-read count;
  determining a test threshold level for minimizing the test error rate; and
  calculating the measured effective life includes calculating the measured effective life using the programming error rate, the initial threshold level, the test error rate, the test threshold level, or a combination thereof.

9. The method as claimed in claim 6 further comprising:
determining an initial threshold level yielding a predetermined error rate;
wherein:
  generating the test stimulus includes processing a read command after a test-leakage duration;
  measuring the test response includes determining a test threshold level corresponding to the test error rate; and
  calculating the measured effective life includes calculating the measured effective life using the initial threshold level, the test threshold level, or both.

10. The method as claimed in claim 6 wherein:
generating the test stimulus includes processing a write command to the memory array;
measuring the test response includes receiving a write-response having a program-duration for indicating an amount of time spent by the memory array to write data content in the memory array; and
calculating the measured effective life includes calculating the measured effective life using an execution profile and the program-duration.

11. A non-volatile memory system comprising:
a non-volatile memory array;
a memory controller, coupled to the non-volatile memory array, for managing operation of the non-volatile memory array, the memory controller including:
  a stimulus module for generating a test stimulus for a page in a memory array;
  a response module, connected to the stimulus module, for measuring a test response from the page in the memory array based on the test stimulus, the test response including a programming error rate or an erase-duration;
  a reliability calculation module, connected to the response module, for calculating a measured effective life of the page in accordance with the programming error rate or the erase-duration; and
  a balance plan module, connected to the reliability calculation module, for determining a use plan according to the measured effective life for accessing the page.

12. The system as claimed in claim 11 further comprising:
an error tracking module, connected to the response module, for storing the programming error rate from reading the page in the memory array;
a threshold adjustment module, connected to the reliability calculation module, for shifting a read threshold for reading data content from the memory array;
a data read module, connected to the stimulus module, for reading the page according to a test-read count;
an error detection module, connected to the operational command module, for determining a test error rate after reading the page according to the test-read count; and
wherein:
  the reliability calculation module is for calculating the measured effective life using the programming error rate, the test error rate, or both.

13. The system as claimed in claim 11 further comprising:
a sum storage module, connected to the reliability calculation module, for storing a pretest sum of data content stored in the memory array;
a pulse module, connected to the response module, for sending data-setting pulses controlled by a pulse count for setting the data content high in the memory array;
a data read module, connected to the pulse module, for reading updated data stored in the memory array in response to the data-setting pulses; and
an updated-sum module, connected to the data read module, for calculating a total sum of the updated data;
wherein:
  the reliability calculation module is for calculating the measured effective life using the total sum of the updated data stored in the memory array and the pretest sum.

14. The system as claimed in claim 11 further comprising:
a threshold adjustment module, connected to the reliability calculation module, for determining an initial threshold level minimizing the programming error rate;
an operational command module, connected to the response module, for processing a read command after a test-leakage duration; and
an error detection module, connected to the operational command module, for determining a test threshold level minimizing a test error rate;
wherein:
  the reliability calculation module is for calculating the measured effective life using the programming error rate, the test error rate, the initial threshold level, the test threshold level, or a combination thereof.

15. The system as claimed in claim 11 further comprising:
an operational command module, connected to the response module, for processing an erase command; and
a data read module, connected to the operational command module, for receiving an erase-response having the erase-duration for indicating an amount of time spent by the memory array to erase data content in the memory array;
wherein:
  the reliability calculation module is for calculating the measured effective life using an execution profile and the erase-duration.

16. The system as claimed in claim 11 wherein:
the stimulus module is for generating a test stimulus for a page, an erase block, or a combination thereof in a memory array;
the response module is for measuring a test response from the page, the erase block, or the combination thereof in the memory array based on the test stimulus;
the reliability calculation module is for calculating a measured effective life of the page, the erase block, or the combination thereof from the test response;
the balance plan module is for determining a use plan for balancing usage of the page, the erase block, or a combination thereof according to the measured effective life relative to the memory array; and
further comprising:
  a wear balancing module, connected to the balance plan module, for managing the usage of the memory array according the use plan for performing wear-leveling.

17. The system as claimed in claim 16 further comprising:
a threshold adjustment module, connected to the reliability calculation module, for determining an initial threshold level for yielding a predetermined error rate;

a data read module, connected to the pulse module, for reading the page according to a test-read count; and an error detection module, connected to the operational command module, for determining a test threshold level for yielding the predetermined error rate after reading the page according to the test-read count;

wherein:
   the reliability calculation module is for calculating the measured effective life using the initial threshold level, the test threshold level, or both.

18. The system as claimed in claim 16 further comprising:
an error tracking module, connected to the response module, for determining the programming error rate from reading the page in the memory array;

a threshold adjustment module, connected to the reliability calculation module, for determining an initial threshold level for minimizing the programming error rate;

a data read module, connected to the pulse module, for reading the page according to a test-read count; and an error detection module, connected to the operational command module, for determining a test error rate after reading the page according to the test-read count;

wherein:
   the threshold adjustment module is for determining a test threshold level for minimizing the test error rate; and
   the reliability calculation module is for calculating the measured effective life using the programming error rate, the initial threshold level, the test error rate, the test threshold level, or a combination thereof.

19. The system as claimed in claim 16 further comprising:
a threshold adjustment module, connected to the reliability calculation module, for determining an initial threshold level yielding a predetermined error rate;

an operational command module, connected to the response module, for processing a read command after a test-leakage duration; and an error detection module, connected to the operational command module, for determining a test threshold level corresponding to the test error rate;

wherein:
   the reliability calculation module is for calculating the measured effective life using the initial threshold level, the test threshold level, or both.

20. The system as claimed in claim 16 further comprising:
an operational command module, connected to the response module, for processing a write command to the memory array; and a data read module, connected to the operational command module, for receiving a write-response having a program-duration for indicating an amount of time spent by the memory array to write data content in the memory array;

wherein:
   the reliability calculation module is for calculating the measured effective life using an execution profile and the program-duration.

* * * * *